(12) United States Patent
Lee et al.

(10) Patent No.: US 10,372,218 B2
(45) Date of Patent: Aug. 6, 2019

(54) TOUCH SENSITIVE ELEMENT AND DISPLAY DEVICE INCLUDING THE SAME

(71) Applicant: LG Display Co., Ltd., Seoul (KR)

(72) Inventors: YongWoo Lee, Goyang-si (KR); YongSu Ham, Seoul (KR); TaeHeon Kim, Seoul (KR); KyungYeol Ryu, Goyang-Si (KR); YuSeon Kho, Seoul (KR); MyungJin Lim, Goyang-Si (KR); SeulGi Choi, Incheon (KR)

(73) Assignee: LG Display Co., Ltd., Seoul (KR)

( * ) Notice: Subject to any disclaimer, the term of this patent is extended or adjusted under 35 U.S.C. 154(b) by 25 days.

(21) Appl. No.: 15/798,164

(22) Filed: Oct. 30, 2017

(65) Prior Publication Data

US 2018/0120942 A1  May 3, 2018

(30) Foreign Application Priority Data

Oct. 31, 2016 (KR) ........................ 10-2016-0143740

(51) Int. Cl.
| | |
|---|---|
| *G06F 3/01* | (2006.01) |
| *H01L 41/09* | (2006.01) |
| *G02F 1/1333* | (2006.01) |
| *G02F 1/1343* | (2006.01) |
| *G06F 3/041* | (2006.01) |

(Continued)

(52) U.S. Cl.
CPC .......... *G06F 3/016* (2013.01); *G02F 1/13338* (2013.01); *G02F 1/133305* (2013.01); *G02F 1/134363* (2013.01); *G06F 3/041* (2013.01); *G06F 3/044* (2013.01); *G06F 3/0412* (2013.01); *H01L 41/0477* (2013.01); *H01L 41/08* (2013.01); *H01L 41/098* (2013.01); *H01L 41/193* (2013.01); *G06F 2203/04102* (2013.01); *G06F 2203/04112* (2013.01); *H01L 27/323* (2013.01)

(58) Field of Classification Search
CPC ..... H01H 41/098; G06F 3/016; G06F 3/0412; G06F 2203/04102; G06F 1/1652; H01L 41/047; H01L 41/293; H01L 41/0986
See application file for complete search history.

(56) References Cited

U.S. PATENT DOCUMENTS

| | | | |
|---|---|---|---|
| 9,727,157 B2* | 8/2017 | Ham | G06F 3/0412 |
| 2008/0089832 A1* | 4/2008 | Aoki | B41J 2/14233 |
| | | | 423/608 |

(Continued)

FOREIGN PATENT DOCUMENTS

WO    WO 2015/186771 A1    12/2015

OTHER PUBLICATIONS

European Patent Office, Extended European Search Report and Opinion, EP Patent Application No. 17198264.8, dated Jun. 25, 2018, 15 pages.

(Continued)

*Primary Examiner* — Sanjiv D. Patel
(74) *Attorney, Agent, or Firm* — Fenwick & West LLP

(57) ABSTRACT

There is provided a touch sensitive element including an electroactive layer, and an electrode disposed on at least one surface of the electroactive layer. The electroactive layer has a first portion having a first thickness and a second portion which has a second thickness different from the first thickness and is in contact with the first portion at an outside of the first portion.

27 Claims, 11 Drawing Sheets

(51) Int. Cl.
    *G06F 3/044*     (2006.01)
    *H01L 41/047*     (2006.01)
    *H01L 41/08*     (2006.01)
    *H01L 41/193*     (2006.01)
    *H01L 27/32*     (2006.01)

(56) References Cited

U.S. PATENT DOCUMENTS

| | | | |
|---|---|---|---|
| 2010/0171393 A1 | 7/2010 | Pei et al. | |
| 2011/0050049 A1* | 3/2011 | Shimizu | B41J 2/14233 |
| | | | 310/367 |
| 2011/0115340 A1* | 5/2011 | Lee | G06F 3/016 |
| | | | 310/348 |
| 2016/0154461 A1 | 6/2016 | Kang et al. | |
| 2016/0291729 A1* | 10/2016 | Schardt | G06F 3/016 |
| 2016/0320899 A1* | 11/2016 | Watazu | G06F 3/047 |
| 2017/0044589 A1* | 2/2017 | Johnson | C12Q 1/18 |
| 2017/0068318 A1* | 3/2017 | McClure | G06F 3/016 |
| 2017/0083098 A1 | 3/2017 | Usui | |

OTHER PUBLICATIONS

Partial European Search Report for European Patent Application No. EP 17198264.8, dated Mar. 8, 2018, 14 Pages.

\* cited by examiner

TOUCH SENSITIVE ELEMENT AND DISPLAY DEVICE INCLUDING THE SAME

CROSS-REFERENCE TO RELATED APPLICATIONS

This application claims the priority of to Republic of Korean Patent Application No. 10-2016-0143740 filed on Oct. 31, 2016, in the Korean Intellectual Property Office, the disclosure of which is incorporated herein by reference in its entirety.

BACKGROUND

Field

The present disclosure relates to a touch sensitive element and a display device including the same and more particularly, to a touch sensitive element which reduces a fault rate and generates high vibration with a low driving voltage and a display device including the same.

Description of the Related Art

A touch element is a device which senses a user's touch input such as screen touch to a display device and is widely utilized for display devices of public facilities and a large size display device such as a smart television (TV), in addition to a portable display device such as a smart phone or a tablet portable computer (PC). An operation type of the touch element may include a resistive type, a capacitive type, an optical type, and electromagnetic (EM) type.

However, recently, in addition to the sensing of the user's touch input, studies on a haptic device which transmits a tactile feedback sensed by a finger of the user or a stylus pen of the user as a feedback for the user's touch input are being performed.

Such a haptic device, a haptic device to which an eccentric rotating mass (ERM) is applied, a haptic device to which a linear resonant actuator (LRA) is applied, and a haptic device to which a piezo ceramic actuator is applied are used. However, the above-mentioned haptic devices are configured by an opaque material and do not vibrate a specific part of the display device, but vibrate the entire display device. Further, the above-mentioned haptic devices do not provide various vibration feelings and are easily broken by an external impact due to low durability.

SUMMARY

An object of the present disclosure is to provide a touch sensitive element in which a short-circuit defect due to a small thickness of an electroactive layer is significantly reduced and a display device including the same.

Another object of the present disclosure is to provide a touch sensitive element with an excellent vibration strength and a display device including the same.

Objects of the present disclosure are not limited to the above-mentioned objects, and other objects, which are not mentioned above, can be clearly understood by those skilled in the art from the following descriptions.

According to an aspect of the present disclosure, there is provided a touch sensitive element, including: an electroactive layer comprising a first portion of a first thickness and a second portion of a second thickness that is greater than the first thickness; a first electrode electrically coupled to a surface of the electroactive layer; and a second electrode electrically coupled to a same surface or a different surface of the electroactive layer as the first electrode, the electroactive layer configured to vibrate responsive to applying a voltage difference between the second electrode and the first electrode Therefore, an intensity of an electric field applied to the first portion may be increased and a dielectric breakdown voltage of the second portion may be increased. Therefore, it is possible to simultaneously improve the vibration strength of the touch sensitive element and minimize a wiring short fault due to dielectric breakdown.

According to another aspect of the present disclosure, there is provided a display device including a structure; a touch sensitive element over the structure, the touch sensitive element comprising: an electroactive layer comprising a first portion of a first thickness and a second portion of a second thickness that is greater than the first thickness; a first electrode electrically coupled to a surface of the electroactive layer; a second electrode electrically coupled to a same surface or a different surface of the electroactive layer as the first electrode, the electroactive layer configured to vibrate responsive to applying a voltage difference between the second electrode and the first electrode, and a touch element over the touch sensitive element, the touch element configured to sense touch and includes a plurality of touch electrodes. Therefore, an intensity of the electric field applied to the first portion of the electroactive layer is increased and a vertical vibration of the first portion may be further amplified in the space between the first portion and the structure. As a result, the display device may transmit excellent tactile feedback to the user.

According to another aspect of the present disclosure, a display device comprises: a display panel; a cover window over the display panel; and a touch sensitive element under the cover window, the touch sensitive element including: an electroactive layer configured to vibrate responsive to an application of an electric field to the electroactive layer, the electroactive layer comprising a first portion having a first thickness and a second portion having a second thickness that is greater than the first thickness.

Other detailed matters of the exemplary embodiments are included in the detailed description and the drawings.

According to the present disclosure, an electroactive layer including a first portion and a second portion having different thicknesses is used to reduce a wiring short-circuit defect generated due to dielectric breakdown of the electroactive layer at a contact point of the wiring line and the electrode.

According to the present disclosure, an electroactive layer having a small thickness in a region where an electrode is disposed is used to improve a vibration strength of the electroactive layer and an air gap is formed in a downward direction of the electroactive layer to maximize a vibration strength in an upward direction.

The effects according to the present disclosure are not limited to the contents exemplified above, and more various effects are included in the present specification.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION OF THE EMBODIMENT

Figure 1:
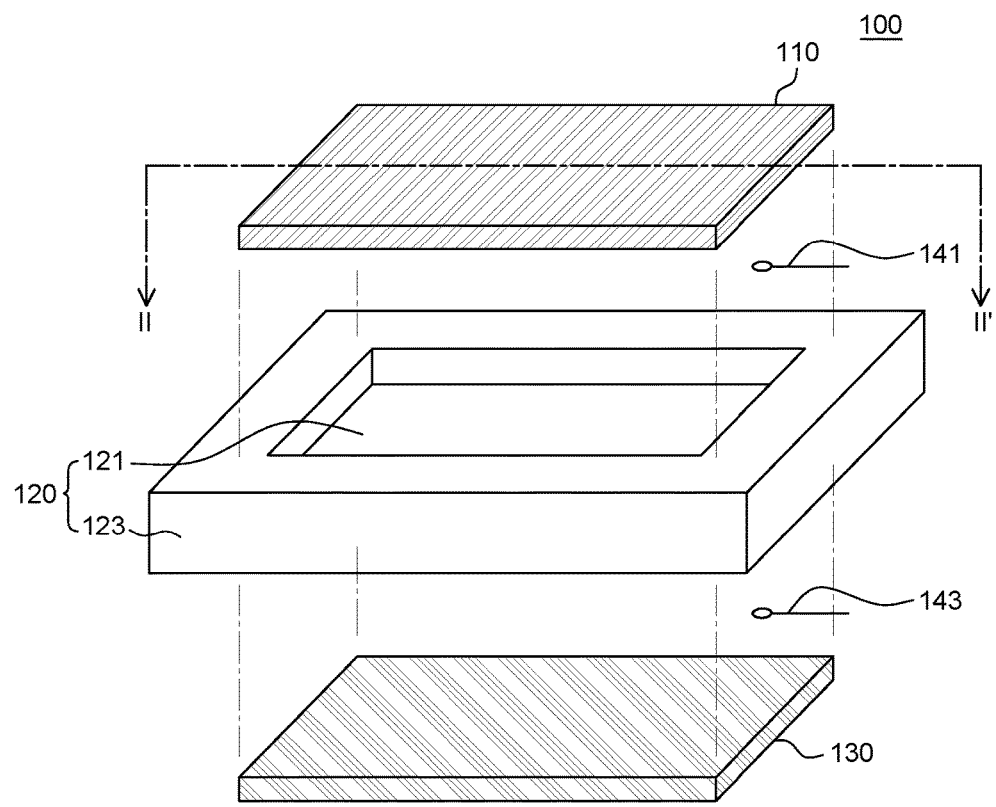
FIG. 1 is an exploded perspective view of a touch sensitive element according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to exemplary embodiment disclosed herein but will be implemented in various forms. The exemplary embodiments are provided by way of example only so that a person of ordinary skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Further, in the following description of the present disclosure, a detailed explanation of known related technologies may be omitted to avoid unnecessarily obscuring the subject matter of the present disclosure. The terms such as "including," "having," and "comprise of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next to", one or more parts may be positioned between the two parts unless the terms are used with the term "immediately" or "directly" is not used.

When an element or layer is disposed "on" other element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely bonded to or combined with each other and can be interlocked and operated in technically various ways as understood by those skilled in the art, and the embodiments can be carried out independently of or in association with each other.

Hereinafter, various exemplary embodiments of the present disclosure will be described in detail with reference to accompanying drawings.

Figure 2:
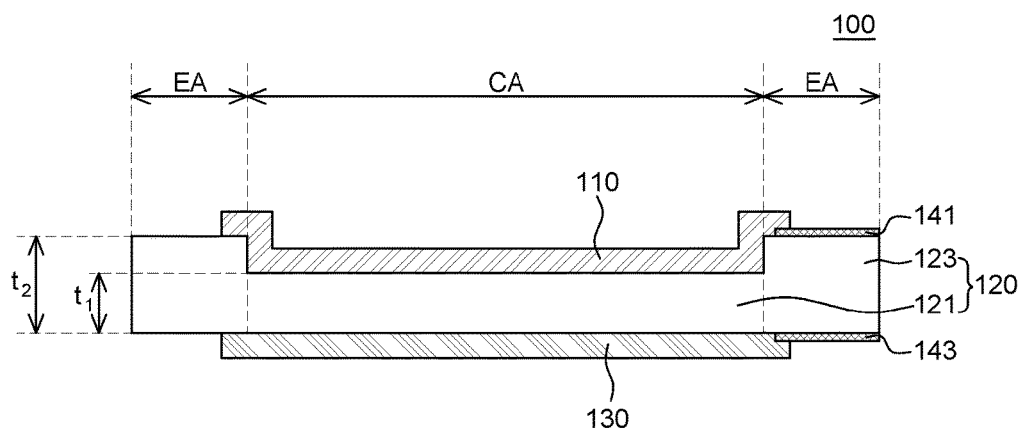
FIG. 2 is a cross-sectional view taken along the line II-II' of FIG. 1 according to an exemplary embodiment of the present disclosure.

FIG. 1 is an exploded perspective view of a touch sensitive element according to an exemplary embodiment of the present disclosure. FIG. 2 is a cross-sectional view taken along the line II-II' of FIG. 1 according to an exemplary embodiment of the present disclosure. Referring to FIGS. 1 and 2, a touch sensitive element 100 includes an electroactive layer 120, a first electrode 110, a second electrode 130, a first wiring line 141, and a second wiring line 143. In FIGS. and 2, upper and lower portions of the touch sensitive element 100 are illustrated to be inverted so that the characteristics of the touch sensitive element 100 according to an exemplary embodiment of the present disclosure are clearly shown. That is, in FIGS. 1 and 2, it is illustrated that the first electrode 110 is disposed on an upper surface of the electroactive layer 120 and the second electrode 130 is disposed on a lower surface of the electroactive layer 120. However, in other embodiments the first electrode 110 is disposed on the lower surface of the electroactive layer 120 and the second electrode 130 is disposed on the upper surface of the electroactive layer 120. Hereinafter, a direction in which the first electrode 110 is disposed is referred to as an upward direction and a direction in which the second electrode 130 is disposed is referred to as a downward direction.

The first electrode 110 and the second electrode 130 are disposed on at least one surface of the electroactive layer 120. For example, the first electrode 110 is disposed on an upper surface of the electroactive layer 120 and the second electrode 130 is disposed on a lower surface of the electroactive layer 120. The first electrode 110 and the second electrode 130 are electrodes which apply voltages to the electroactive layer 120 and are formed of a conductive material. Further, in order to secure light transmittance of the touch sensitive element 100, the first electrode 110 and the second electrode 130 may be formed of a transparent conductive material. For example, the first electrode 110 and the second electrode 130 may be formed of a transparent conductive material such as indium tin oxide (ITO), aluminum doped zinc oxide (AZO), fluorine tin oxide (FTC), or silver-nano wire (AgNW). Further, the first electrode 110 and the second electrode 130 may be configured by a metal mesh. That is, the first electrode 110 and the second electrode 130 are configured by a metal mesh in which a metal material is disposed in a mesh form so that the first electrode 110 and the second electrode 130 may substantially serve as transparent electrodes. However, the components of the first electrode 110 and the second electrode 130 are not limited to the above-described example, but various transparent conductive materials may be used as the components of the first electrode 110 and the second electrode 130. The first electrode 110 and the second electrode 130 may be formed of the same material or formed of different materials.

The first wiring line 141 and the second wiring line 143 are electrically connected to the first electrode 110 and the second electrode 130, respectively and transmit an electrical signal to the first electrode 110 and the second electrode 130. The first wiring line 141 and the second wiring line 143 may be formed of a metal having a low resistance so as to precisely transmit the electrical signal. For example, the first wiring line 141 and the second wiring line 143 may be formed of copper (Cu), aluminum (Al), molybdenum (Mo), titanium (Ti), and an alloy including the same which have a low resistance.

The first wiring line 141 and the second wiring line 143 are in contact with the first electrode 110 and the second electrode 130, respectively, in an edge area (EA) of the electroactive layer 120. The first electrode 110 and the second electrode 130 form an electric field based on the electrical signal transmitted from the first wiring line 141 and the second wiring line 143 and vibrate the electroactive layer 120.

The electroactive layer 120 is a plate-shaped film formed of an electroactive polymer which is a polymer material deformed by an electrical stimulation. For example, the electroactive layer 120 may be formed of a dielectric elastomer such as silicon based, urethane based, or acryl based dielectric elastomer, a ferroelectric polymer such as a poly vinylidene fluoride (PVDF), poly(vinylidene fluoride-trifluoroethylene)(P(VDF-TrFE)), or poly(vinylidene fluoride-trifluoroethylene-chlorofluoroethylene(PVDF-TrFE-CFE), or a piezo ceramic element. When the electroactive layer 120 is formed of a dielectric elastomer, the dielectric elastomer is contracted or expanded by electrostatic attraction (coulombic force) generated as a voltage is applied to the electroactive layer 120 so that the touch sensitive element 100 may vibrate. When the electroactive layer 120 is formed of ferroelectric polymer, an alignment direction of a dipole in the electroactive layer 120 is changed as the voltage is applied to the electroactive layer 120 so that the touch sensitive element may vibrate. Since the transmittance of a film type electroactive layer 120 is excellent, the touch sensitive element 100 is attached on a front surface of the display panel to be easily applied to the display device.

The electroactive layer 120 includes a core area CA and an edge area EA. The core area CA of the electroactive layer 120 refers to an area where the first electrode 110 and the second electrode 130 are disposed and the edge area EA of the electroactive layer 120 is an outside area of the core area CA and refers to an area where the first wiring line 141 and the second wiring line 143 are disposed.

The electroactive layer 120 has a first portion 121 having a first thickness $t_1$ and a second portion 123 having a second thickness $t_2$. The first portion 121 corresponds to the core area CA and the second portion 123 corresponds to the edge area EA. The second portion 123 is in contact with the first portion 121 at the boundary between the core area CA and the edge area EA. For example, as illustrated in FIG. 1, the second portion 123 encloses the first portion 121. The first portion 121 and the second portion 123 are one connected layer and have different thicknesses. In other words, the electroactive layer 120 is one film formed of an electroactive polymer and is divided into portions 121 and 123 having different thicknesses.

The first electrode 110 and the second electrode 130 are in contact with the first portion 121 of the electroactive layer 120. For example, as illustrated in FIG. 2, the first electrode 110 is in contact with an upper surface of the first portion 121 and the second electrode 130 is in contact with a lower surface of the first portion 121. The first wiring line 141 and the second wiring line 143 are in contact with the second portion 123. For example, the first wiring line 141 is in contact with the upper surface of the second portion 123 and the second wiring line 143 is in contact with the lower surface of the second portion 123. The first electrode 110 is in contact with the first wiring line 141 on the upper surface of the second portion 123 and the second electrode 130 is in contact with the second wiring line 143 on the lower surface of the second portion 123.

A first thickness $t_1$ of the first portion 121 of the electroactive layer 120 is less than the second thickness $t_2$ of the second portion 123. Therefore, the thickness of the core area CA in which the first electrode 110 and the second electrode 130 are disposed is smaller than a thickness of the edge area EA in which the first wiring line 141 and the second wiring line 143 are disposed. The first wiring line 141 and the second wiring line 143 are in contact with the first electrode 110 and the second electrode 130 in the second portion 123 of the electroactive layer 120 corresponding to the edge area (EA).

The first portion 121 of the electroactive layer 120 has a first thickness $t_1$ which is less than the second thickness $t_2$ of the second portion 123. The first thickness $t_1$ may be equal to or less than 35 μm and the second thickness $t_2$ may be equal to or greater than 50 μm. However, the ranges of the first thickness $t_1$ and the second thickness $t_2$ are not limited thereto.

Since the first portion 121 of the electroactive layer 120 has the first thickness $t_1$ which is less than the second portion 123, a vibration strength of the touch sensitive element 100 may be improved. As mentioned above, the electroactive layer 120 is configured to be vibrated by the electric field between the first electrode 110 and the second electrode 130. Since the intensity of the electric field is inversely proportional to a distance, the closer the distance between the first electrode 110 and the second electrode 130, the larger the intensity of the electric field applied to the electroactive layer 120. Further, the vibration strength of the electroactive layer 120 may be increased. For example, when the first thickness $t_1$ of the first portion 121 is equal to or less than 35 μm, the electric field between the first electrode 110 and the second electrode 130 may be maximized.

Further, since the second portion 123 of the electroactive layer 120 has the second thickness $t_2$ which is larger than the first portion 121, a fault rate of the touch sensitive element 100 may be reduced. That is, the touch sensitive element 100 according to the exemplary embodiment of the present disclosure includes the electroactive layer 120 having different thicknesses in the core area CA and the edge area EA. Therefore, the fault rate of the touch sensitive element 100 may be reduced while improving the vibration strength.

Specifically, as mentioned above, the smaller the thickness of the electroactive layer, the larger the intensity of the electric field applied to the electroactive layer. Therefore, the electroactive layer may generate high vibration with a low driving voltage. However, the small thickness of the electroactive layer may reduce electrical durability of the electroactive layer. For example, dielectric breakdown may easily occur in the electroactive layer due to the small thickness of the electroactive layer. The dielectric breakdown refers to a phenomenon in that when a high electric field is instantaneously applied to an insulator, current flows while the resistance of the insulator is reduced. The dielectric breakdown of the electroactive layer may be generated by various causes. For example, when there are minute holes or defects such as a foreign substance in the electroactive layer and a strong electric field is instantaneously applied to a defected part, charges are instantaneously concentrated in the defected part to cause the dielectric breakdown. When the thickness of the electroactive layer is sufficiently large, even though the charges are concentrated in the defected part, the concentrated charges need to move a relatively long distance so that the dielectric breakdown of the electroactive layer hardly occurs. However, when the thickness of the electroactive layer is small, the charges concentrated in the defected part may move a relatively short distance, so that the dielectric breakdown may easily occur.

Specifically, the dielectric breakdown of the electroactive layer may frequently occur in a contact point where the electrode and the wiring line are in contact with each other. Specifically, the surface of the electrode and the surface of the wiring line are in contact with each other at the contact point. However, since the surface of the electrode and the surface of the wiring line are not perfectly flat, the surface of the electrode and the surface of the wiring line are not partially in contact with each other. Further, there may be a foreign substrate in the contact area of the electrode and the wiring line, which may interrupt the contact of the electrode and the wiring line. When the voltage is applied to the wiring line, the charges may be relatively well concentrated at an area where the surface of the electrode and the surface of the wiring line are not in contact with each other or where the foreign substance is provided. Further, when the surface of the electrode and the surface of the wiring line are not in contact with each other or a foreign substance flows therebetween, a contact resistance between the electrode and the wiring line may be increased. In this case, heat may be generated at the contact point of the electrode and the wiring line due to the high contact resistance between the electrode and the wiring line. When a temperature of the contact point rises due to the generated heat, the charges are increased due to the increased conductivity due to the heat, so that the dielectric breakdown is induced more effectively. As a result, since the charges are concentrated at the contact point of the electrode and the wiring line more than other portions, the electroactive layer is dielectrically broken more effectively so that the electroactive layer is frequently dielectrically broken at the contact point of the electrode and the wiring line.

When the electroactive layer is dielectrically broken, the current flows through the electroactive layer. Therefore, the wiring lines disposed on at least one surface of the electroactive layer are short-circuited with each other. In this case, the electric field is not completely formed between the electrodes so that the electroactive layer does not vibrate and thus a failure of the touch sensitive element may be caused.

As mentioned above, as the thickness of the electroactive layer is reduced, the vibration strength of the touch sensitive element is improved, but the fault rate of the touch sensitive element due to the dielectric breakdown of the electroactive layer is increased. That is, the vibration strength and a dielectric breakdown voltage according to the thickness of the electroactive layer are in trade-off relationship with each other. For example, the vibration acceleration and the dielectric breakdown voltage according to the thickness of the electroactive layer formed of PVDF-TrFE-CFE are measured as represented in the following Table 1. Here, the vibration acceleration refers to a vibration acceleration when an AC voltage of 400 V at 100 Hz is applied to the electroactive layer.

TABLE 1

| Thickness of electroactive layer | Dielectric breakdown voltage | Vibration acceleration |
| --- | --- | --- |
| 20 µm | 0.55 kV | 1.5 G |
| 30 µm | 0.85 kV | 1.6 G |
| 40 µm | 0.95 kV | 1.3 G |
| 50 µm | 1.35 kV | 1.0 G |
| 60 µm | 1.55 kV | 0.7 G |
| 70 µm | 1.95 kV | 0.6 G |
| 80 µm | 2.00 kV | 0.4 G |
| 90 µm | 2.10 kV | 0.4 G |
| 100 µm | 2.45 kV | 0.3 G |
| 150 µm | 3.00 kV or higher | 0.1 G or lower |
| 200 µm | 3.00 kV or higher | 0.1 G or lower |

As represented in Table 1, in order to implement an excellent vibration strength of 1.5 G or higher, the thickness of the electroactive layer needs to be maintained to be 35 µm or smaller. However, when the thickness of the electroactive layer is smaller than 35 µm, the dielectric breakdown voltage of the electroactive layer is reduced to 1 kV or lower. Therefore, the dielectric breakdown of the electroactive layer may be easily caused and the failure of the touch sensitive element may be easily generated.

A normal touch sensitive element includes an electroactive layer having a uniform thickness and the thicknesses of the core area in which the electrode is disposed and the edge area in which the wiring line is disposed are uniform. In order to improve the vibration strength, when the electroactive layer is formed to have a small thickness, the dielectric breakdown is caused at the contact point of the electrode and the wiring line so that a failure that the wiring lines are short-circuited may be frequently generated. Further, in order to reduce the short-circuit failure, when the electroactive layer is formed to have a large thickness, an intensity of the electric field between the electrodes is weakened, so that the vibration strength may be reduced. Therefore, a normal touch sensitive element including an electroactive layer having a uniform thickness may have a limitation to reduce the fault rate while improving the vibration strength.

The touch sensitive element 100 according to the exemplary embodiment of the present disclosure includes an electroactive layer 120 including a first portion 121 having a first thickness $t_1$ which is small and a second portion 123 having a second thickness $t_2$ which is large. Therefore, it is possible to improve the vibration strength of the touch sensitive element 100 and effectively reduce the fault rate of the touch sensitive element 100.

Specifically, the first portion 121 corresponds to the core area CA in which the first electrode 110 and the second electrode 130 are disposed and has the first thickness $t_1$ which is small. In this case, the intensity of the electric field which is applied to the first portion 121 at the same driving voltage may be increased and the vibration strength of the touch sensitive element 100 according to the same driving voltage may be improved. For example, if the thickness of the first portion 121 is equal to or smaller than 35 µm, the vibration acceleration of the first portion 121 may be equal to or larger than approximately 1.5 G when a driving voltage of 400 V and 100 Hz is applied to both ends of the first electrode 110 and the second electrode 130. In contrast, the second portion 123 corresponds to the edge area EA in which the first wiring line 141 and the second wiring line 143 are disposed and has the second thickness $t_2$ which is large. Even though the first electrode 110 and the second electrode 130 may occupy a part of the edge area EA, the first electrode 110 and the second electrode 130 are not disposed in the most of the edge area EA. Therefore, the second portion 123 of the electroactive layer 120 hardly vibrates. That is, even though the second thickness $t_2$ of the second portion 123 is large, it hardly affects the vibration strength of the touch sensitive element 100. In the meantime, the first electrode 110 and the first wiring line 141 are in contact with each other and the second electrode 130 and the second wiring line 143 are in contact with each other, on the second portion 123. As mentioned above, the dielectric breakdown may be easily generated at the contact point where the electrode and the wiring line are in contact with each other. However, the first electrode 110 and the second electrode 130 are in contact with the first wiring line 141 and the second wiring line 143, respectively, on the second portion 123 having a second thickness $t_2$ which is large. Therefore, the dielectric breakdown voltage of the electroactive layer 120 is increased and the fault rate of the touch sensitive element 100 due to the dielectric breakdown of the electroactive layer 120 may be lowered. For example, when the second thickness $t_2$ of the second portion 123 is equal to or large than 50 µm, the dielectric breakdown voltage of the second portion 123 may be equal to or higher than 1.35 kV. Therefore, the dielectric breakdown of the second portion 123 may be minimized and the fault rate of the touch sensitive element 100 may be lowered. Therefore, the touch sensitive element 100 according to the exemplary embodiment of the present disclosure simultaneously improves the vibration strength and reduces the short-circuit fault rate which is easily generated at the contact point of the electrode and the wiring line.

Figure 3:
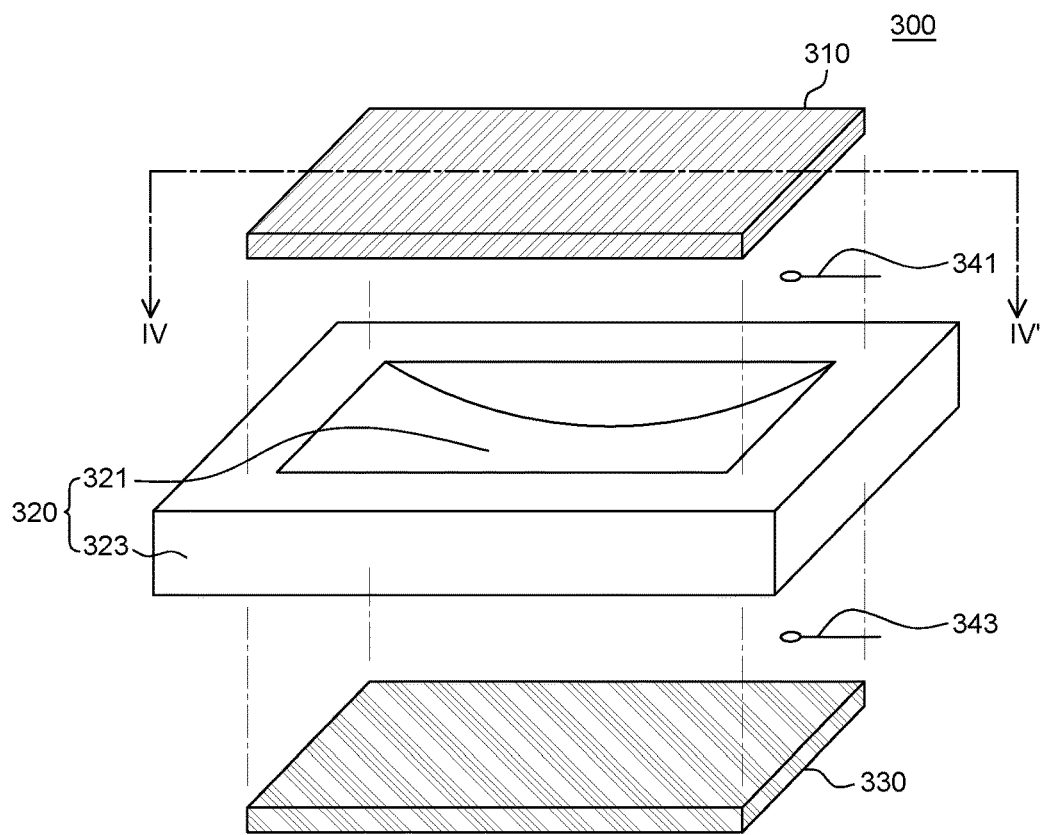
FIG. 3 is an exploded perspective view of a touch sensitive element according to another exemplary embodiment of the present disclosure.
Figure 4:
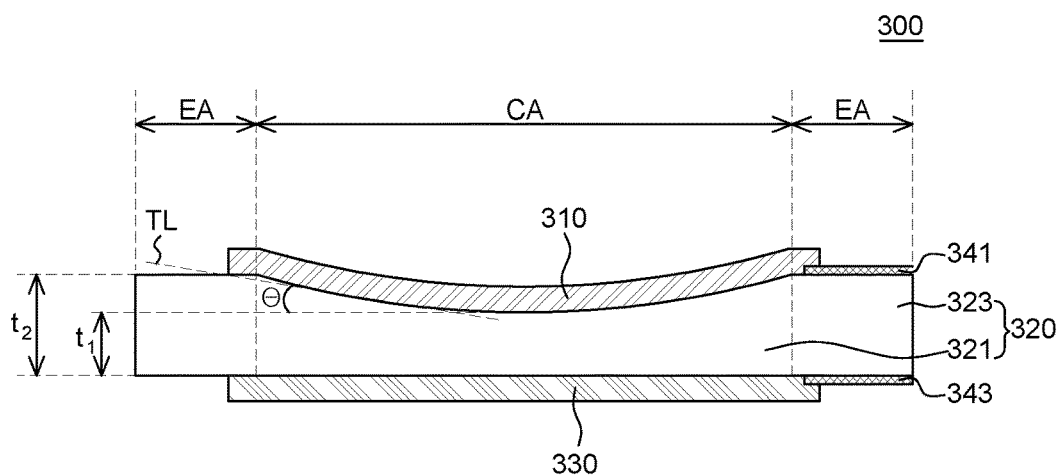
FIG. 4 is a cross-sectional view taken along the line IV-IV' of FIG. 3 according to an exemplary embodiment of the present disclosure.

FIG. 3 is an exploded perspective view of a touch sensitive element according to another exemplary embodiment of the present disclosure. FIG. 4 is a cross-sectional view taken along the line IV-IV' of FIG. 3 according to an exemplary embodiment of the present disclosure. The touch sensitive element 300 illustrated in FIGS. 3 and 4 is the same as the touch sensitive element 100 illustrated in FIGS. 1 and 2, except that the first thickness $t_1$ of the first portion 321 of the electroactive layer 320 is gradually increased toward the edges of the first portion 321. Therefore, a redundant description will be omitted.

Referring to FIGS. 3 and 4, the first thickness $t_1$ of the first portion 321 of the electroactive layer 320 gradually increases from the center of the first portion 321 toward a boundary at which the first portion 321 and the second portion 323 are in contact with each other. Therefore, the lower surface of the electroactive layer 120 corresponding to the core area CA has a concave shape. Since the first thickness $t_1$ of the first portion 321 is equal to or less than the second thickness $t_2$ of the second portion 323, the intensity of the electric field which acts on the first portion 321 at the same driving voltage may be higher than the second portion 323. Therefore, the vibration acceleration of the first portion 321 may be increased and the vibration strength of the touch sensitive element 300 may be improved.

In contrast, the second portion 323 of the electroactive layer 320 has a uniform second thickness $t_2$. Since the first electrode 310 and the second electrode 330 are rarely disposed in the second portion 323, the second portion 323 of the electroactive layer 320 hardly vibrates. In the meantime, the first electrode 310 and the second electrode 330 are in contact with the first wiring line 341 and the second wiring line 343 in the second portion 323 and the second thickness $t_2$ of the second portion 323 is larger than the first thickness $t_1$ of the first portion 321. Therefore, the dielectric breakdown voltage of the second portion 323 may be increased. Therefore, the dielectric breakdown may be hardly generated at the contact point of the first electrode 310 and the first wiring line 341 and the contact point of the second electrode 330 and the second wiring line 343. Accordingly, the fault rate of the touch sensitive element 300 may be reduced.

Specifically, the touch sensitive element 300 according to another exemplary embodiment includes the electroactive layer 320 having the first portion 321 with a first thickness $t_1$ which is gradually increased to the second thickness t2 toward the edge of the first portion 321 located between the core area CA and the edge area EA. Therefore, a step may not be formed between the first portion 321 and the second portion 323 and a gentle slope may be formed between the first portion 321 and the second portion 323. Therefore, it is advantageous to further lower a probability of occurrence of an electrical failure of the electroactive layer 320.

Specifically, the first portion 321 and the second portion 323 of the electroactive layer 320 does not form a sharp corner, but forms a gentle slope. Generally, since the electric field is concentrated at the sharp corner, when a corner is formed between the first portion and the second portion, the electric field is concentrated to the corner portion so that the charges may be concentrated. In this case, the dielectric breakdown of the electroactive layer may be relatively easily generated by the charges concentrated at the corner portion. However, in the electroactive layer 320 of the touch sensitive element 300 according to another exemplary embodiment of the present disclosure, the corner is not formed between the first portion 321 and the second portion 323. Therefore, the charge concentration may be suppressed and thus the dielectric breakdown of the electroactive layer 320 may be more effectively suppressed.

In this case, an inclination θ of the slope of a region where the first thickness $t_1$ of the first portion 321 is gradually increased may be equal to or smaller than 0.1°. Here, the inclination θ of the slope refers to an inclination of a tangent line TL of the slope. When the inclination θ of the slope is larger than 0.1°, there may be a problem in that the charges are concentrated on the slope and the dielectric breakdown voltage of the electroactive layer 320 may be increased.

A ratio of the first thickness $t_1$ of the first portion 321 of the electroactive layer 320 and the second thickness $t_2$ of the second portion 323 may be 1:1.75 to 1:3.5. When the ratio of the first thickness $t_1$ of the first portion 321 and the second thickness $t_2$ of the second portion 323 is lower than 1:1.75, the first thickness $t_1$ of the first portion 321 may be almost the same as the second thickness $t_2$ of the second portion 323. Therefore, the vibration strength of the touch sensitive element 300 may not be improved while substantially reducing the fault rate of the touch sensitive element 300. Further, when the ratio of the first thickness $t_1$ of the first portion 321 and the second thickness $t_2$ of the second portion 323 exceeds 1:3.5, a difference between the first thickness $t_1$ of the first portion 321 and the second thickness $t_2$ of the second portion 323 is too large. Therefore, the inclination of the slope θ is increased and thus the charges may be concentrated on the slope.

Figure 5A:
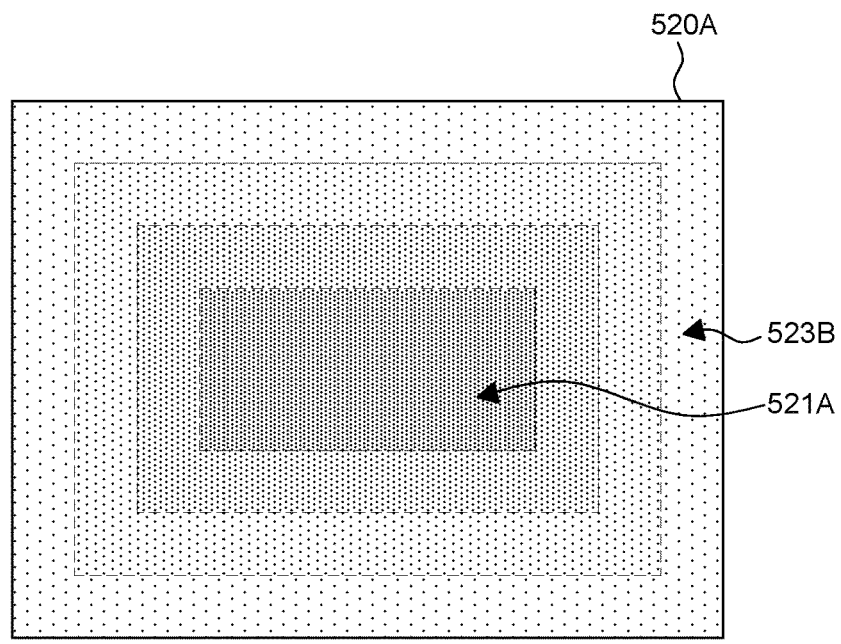
FIGS. 5A to 5C are plan views of an electroactive layer according to various exemplary embodiments of the present disclosure.
Figure 5B:
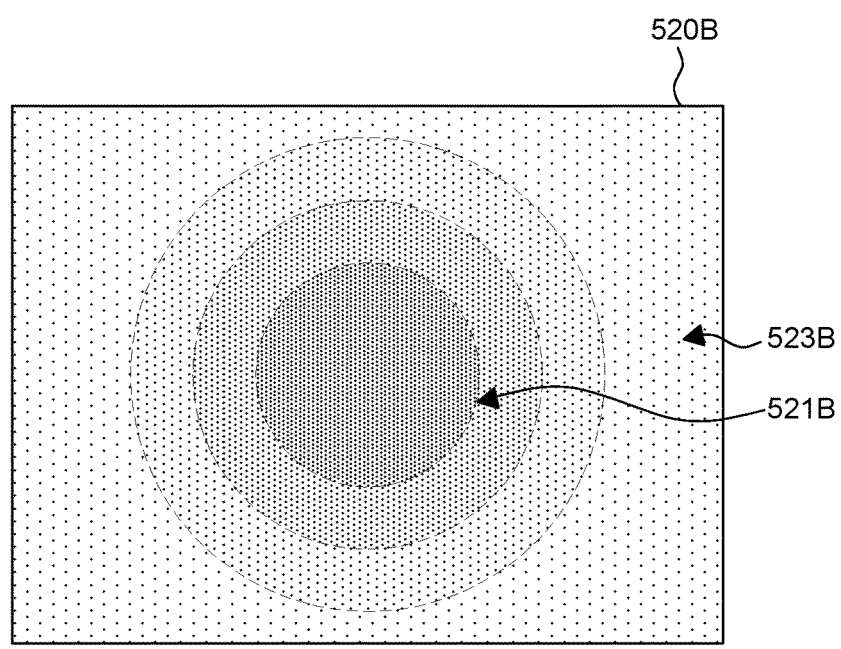
Figure 5C:
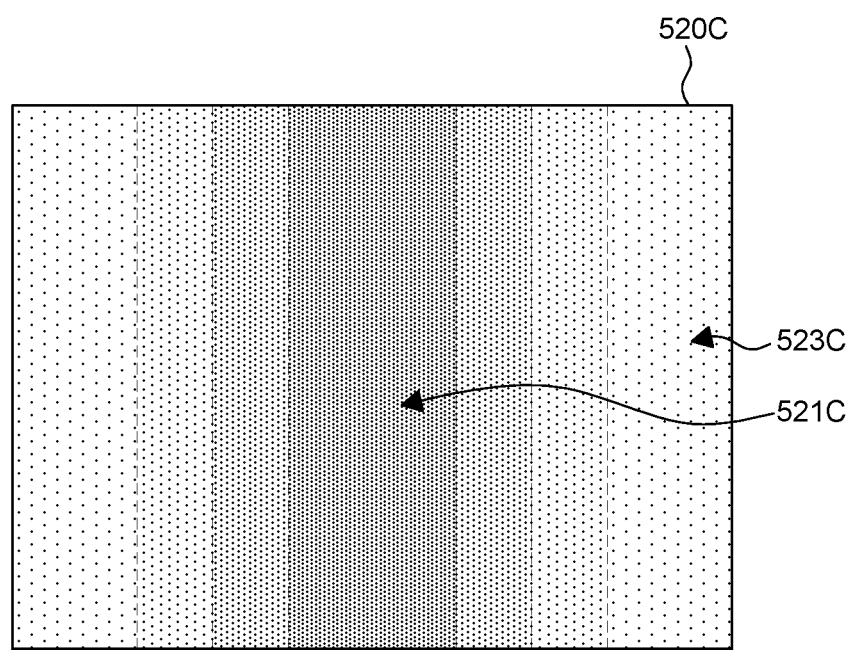

FIGS. 5A to 5C are plan views of an electroactive layer according to various exemplary embodiments of the present disclosure. Referring to FIGS. 5A to 5C, an electroactive layer of a touch sensitive element according to various exemplary embodiments of the present disclosure may include a first portion and the second portion having various shapes. For the convenience of description, in FIGS. 5A to 5C, other components than the electroactive layer are not illustrated and a thickness of the electroactive layer is represented by the concentration of hatching. Specifically, a small thickness is illustrated by a relatively dark hatching and a large thickness is illustrated by a relatively light hatching.

Referring to FIG. 5A, an electroactive layer 520A includes a first portion 521A and a second portion 523A having a quadrangular shape. That is, the second portion 523A encloses the first portion 521A and a boundary line of the second portion 523A and the first portion 521A is quadrangular. A first thickness of the first portion 521A is gradually increased toward the outside of the first portion 521A from the center of the first portion 521A and a slope of the area where the first thickness of the first portion 521A is gradually increased may have a gentle inclination of 0.1° or smaller.

Referring to FIG. 5B, an electroactive layer 520B includes a first portion 521B and a second portion 523B having a circular shape. That is, the second portion 523B encloses the first portion 521B and a boundary line of the second portion 523B and the first portion 521B is circular. A first thickness of the first portion 521B is gradually increased toward the outside of the first portion 521B from the center of the first portion 521B and a slope of the area where the first thickness of the first portion 521B is gradually increased may have a gentle inclination of 0.1° or smaller.

Referring to FIG. 5C, the electroactive layer 520C includes a quadrangular first portion 521C and a quadrangular second portion 520C which is in contact with an outside of the first portion 521C. That is, the second portion 523C is in contact with both sides of the first portion 521C and a boundary line of the second portion 523C and the first portion 521C are a straight line. A first thickness of the first portion 521C is gradually increased toward both sides of the first portion 521C from the center of the first portion 521C and a slope of the area where the first thickness of the first portion 521C is gradually increased may have a gentle inclination of 0.1° or smaller.

As illustrated in FIGS. 5A to 5C, the touch sensitive element according to various exemplary embodiments of the present disclosure includes an electroactive layer including the first portion and the second portion having various shapes, so that a touch sensitive element having various structures may be implemented. For example, when a shape of the electrode is implemented to have a circular shape, as illustrated in FIG. 5B, the boundary line at which the first portion 521A and the second portion 523A of the electroactive layer 520B are in contact with each other is configured to have a circular shape. Therefore, a touch sensitive element with a circular electrode structure may be provided. Further, when the wiring line which is in contact with the electrode is disposed only on both sides of the electroactive layer 520C, as illustrated in FIG. 5C, a boundary line at which the first portion 521C and the second portion 523C of the electroactive layer 520C are in contact with each other is configured to be a straight line. Therefore, the vibration strength of the touch sensitive element may be maximized.

Figure 6:
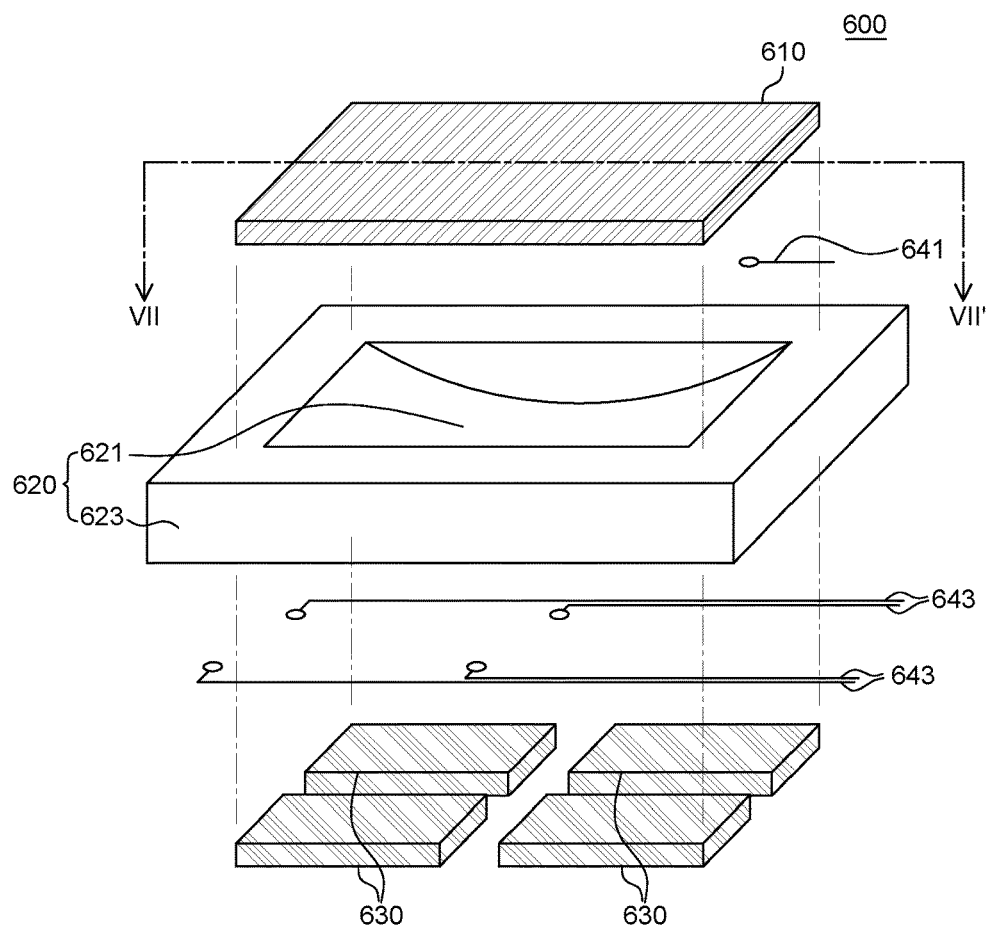
FIG. 6 is an exploded perspective view of a touch sensitive element according to still another exemplary embodiment of the present disclosure.
Figure 7:
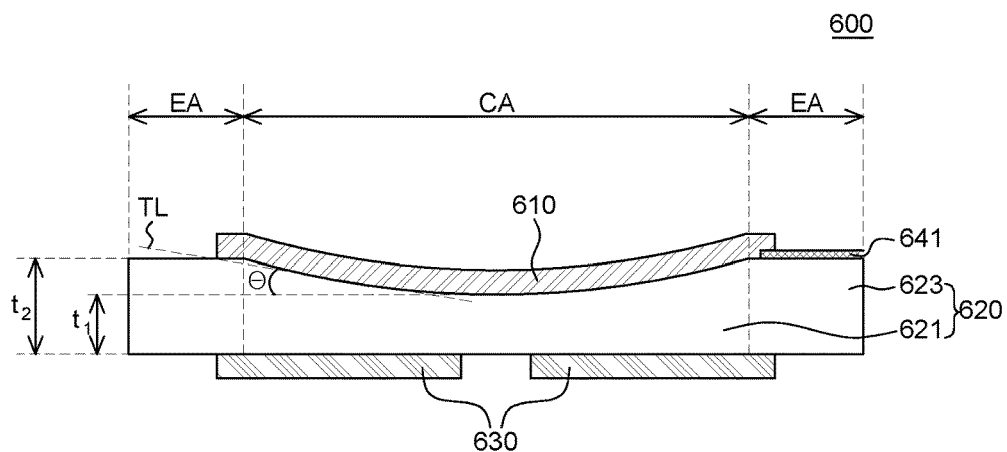
FIG. 7 is a cross-sectional view taken along the line VII-VII' of FIG. 6 according to an exemplary embodiment of the present disclosure.

FIG. 6 is an exploded perspective view of a touch sensitive element according to still another exemplary embodiment of the present disclosure. FIG. 7 is a cross-sectional view taken along the line VII-VII' of FIG. 6. The touch sensitive element 600 illustrated in FIGS. 6 and 7 is the same as the touch sensitive element 300 illustrated in FIGS. 3 and 4 except that a second electrode 630 including a plurality of patterned pattern electrodes is provided. Therefore, a redundant description will be omitted.

Referring to FIGS. 6 and 7, the second electrode 630 includes a plurality of patterned pattern electrodes. In this case, a region where the plurality of pattern electrodes is disposed is defined as one tactile cell. Here, the tactile cell is a minimum unit which transmits a tactile feedback to the user and the tactile cells may independently transmit the tactile feedback. Specifically, a driving voltage may be applied to any one pattern electrode among the plurality of pattern electrodes. In this case, an electric field is generated between the pattern electrode applied with a driving voltage and the first electrode 610 and a part of the electroactive layer 610 disposed between the pattern electrode applied with the driving voltage and the first electrode 610 vibrates so that a tactile feedback may be generated. In this case, the plurality of pattern electrodes is connected to the plurality of second wiring lines 643 and individually provided with a driving voltage through the second wiring line 643.

In the meantime, differently from the second electrode 630, the first electrode 610 is not patterned and is configured as a single electrode. In this case, a common voltage is applied to the first electrode 610 via the first wiring line 641 and the electroactive layer 620 vibrates based on an electric field generated due to a potential difference between the common voltage applied to the first electrode 610 and the driving voltage applied to the second electrode 630. In some exemplary embodiments, the first electrode 610 may be connected to the ground through the first wiring line 641.

In the meantime, an area of a tactile cell, that is, an area of each of the plurality of pattern electrodes may be determined in consideration of a size of a finger of a general person. The touch sensitive element 600 transmits the tactile feedback for the user's touch input so that the tactile cell which is the minimum unit area for transmitting the tactile feedback to the user may be determined in consideration of an area where the user's touch input is generated. In this case, the area where the user's touch input is generated is determined according to the sizes of fingers of a normal human so that the area of the tactile cell is also determined based on the size of the finger of the general person.

In some exemplary embodiments, the area of the tactile cell may also be determined in consideration of the area of the touch cell of the touch element which may be used together with the touch sensitive element 600. Here, the touch cell of the touch element refers to a minimum unit which may sense the user's touch input. When the area of the tactile cell is determined in consideration of the area of the touch cell of the touch element, the tactile cell may correspond to the touch cell of the touch element one to one. In this case, the touch sensitive element 600 may provide a tactile feedback to an exact point to which the user's touch input is applied.

The second wiring lines 643 are connected to the plurality of pattern electrodes of the second electrode 630 one to one. As mentioned above, each of the plurality of pattern electrodes may be applied with the driving voltage through the second wiring lines 643 and partially vibrate the electroactive layer 620. The second wiring lines 643 are in contact with the plurality of pattern electrodes on the second portion 623 of the electroactive layer 620. For example, the second wiring lines 643 extend to both outsides of the second electrode 630 along the edge area EA and are in contact with corners of the plurality of pattern electrodes in the edge area EA. When the touch sensitive element 600 is applied to the display device, the edge area EA in which the second wiring lines 643 extend may correspond to a bezel area of the display device. In this case, the lowering of visibility of the display device due to the second wiring lines 643 formed of metal may be minimized.

A touch sensitive element 600 according to still another exemplary embodiment of the present disclosure includes a second electrode 630 including a plurality of patterned pattern electrodes so that more detailed tactile feedback may be provided to the user. That is, different voltages or a voltage with different frequencies may be applied to the plurality of pattern electrodes and the tactile cells corresponding to the plurality of pattern electrodes generate different vibration to provide detailed tactile feedback to the user.

In the meantime, the first portion 621 of the electroactive layer 620 corresponding to the core area CA in which the first electrode 610 and the second electrode 630 are disposed has a thickness smaller than that of the second portion 623 corresponding to the edge area EA in which the first wiring line 641 and the second wiring line 643 are disposed. Therefore, the vibration strength of the first portion 621 may be improved at the same driving voltage. In the meantime, the second thickness $t_2$ of the second portion 623 corresponding to the edge area EA in which the first wiring line 641 is in contact with the first electrode 610 and the second wiring line 643 is in contact with the second electrode 630 is larger than the first thickness $t_1$ of the first portion 621. Therefore, the dielectric breakdown which may be generated at the contact point of the first wiring line 641 and the first electrode 610 and the contact point of the second wiring line 643 and the second electrode 630 may be minimized.

Figure 8:
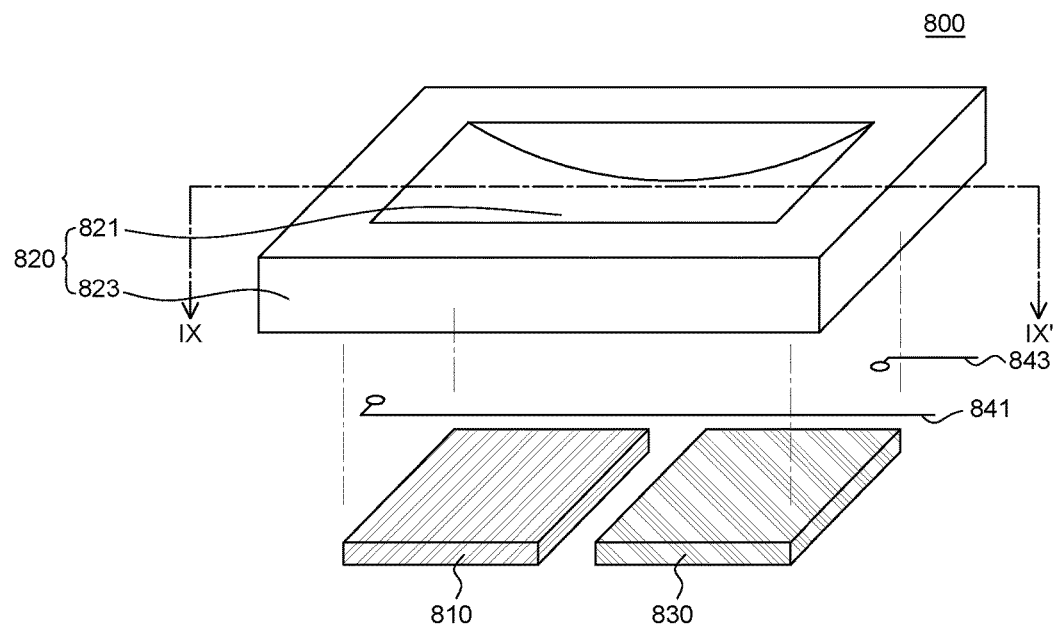
FIG. 8 is an exploded perspective view of a touch sensitive element according to still another exemplary embodiment of the present disclosure.
Figure 9:
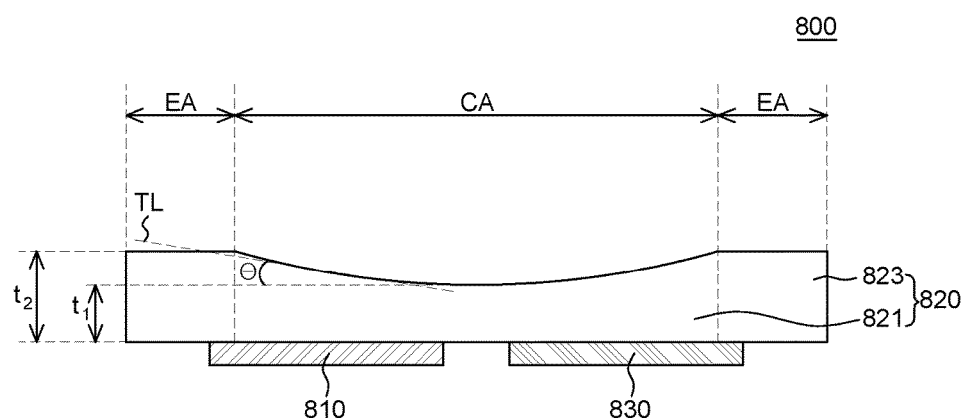
FIG. 9 is a cross-sectional view taken along the line IX-IX' of FIG. 8 according to an exemplary embodiment of the present disclosure.

FIG. 8 is an exploded perspective view of a touch sensitive element according to still another exemplary embodiment of the present disclosure. FIG. 9 is a cross-sectional view taken along the line IX-IX' of FIG. 8. A touch sensitive element 800 illustrated in FIGS. 8 and 9 is the same as the touch sensitive element 300 illustrated in FIGS. 3 and 4 except that a first electrode 810 and a second electrode 830 are disposed on the same surface of the electroactive layer 820. Therefore, a redundant description will be omitted.

Referring to FIGS. 8 and 9, the first electrode 810 and the second electrode 830 are disposed on the same surface of the electroactive layer 820. Further, a first wiring line 841 which is in contact with the first electrode 810 and a second wiring line 843 which is in contact with the second electrode 830 are disposed on the same surface of the electroactive layer 820. In this case, a horizontal electric field may be generated between the first electrode 810 and the second electrode 830 based on a potential difference between the first electrode 810 and the second electrode 830. The electroactive layer 820 may vibrate based on the horizontal electric field between the first electrode 810 and the second electrode 830.

A touch sensitive element 800 according to still another exemplary embodiment of the present disclosure includes the first electrode 810 and the second electrode 830 formed on the same surface of the electroactive layer 820. Therefore, the touch sensitive element 800 may provide excellent visibility. As mentioned above, the first electrode 810 and the second electrode 830 may be formed of a transparent conductive material. Even though the first electrode 810 and the second electrode 830 are formed of a transparent conductive material, a part of light which is incident onto the first electrode 810 and the second electrode 830 may be reflected or absorbed by the first electrode 810 and the second electrode 830. Therefore, since there is light which does not pass through the first electrode 810 and the second electrode 830 among the light which is incident onto the first electrode 810 and the second electrode 830, the light transmittance of the touch sensitive element 800 may be lowered due to the first electrode 810 and the second electrode 830. Specifically, when the first electrode 810 and the second electrode 830 are disposed on both surfaces of the electroactive layer 820, the transmittance may be further lowered due to the first electrode 810 and the second electrode 830. However, in the touch sensitive element 800 according to the exemplary embodiment of the present disclosure, the first electrode 810 and the second electrode 830 formed of a transparent conductive material are disposed on one surface of the electroactive layer 820. Therefore, the number of electrodes through which the light incident onto the touch sensitive element 800 passes is reduced, so that the transmittance of the touch sensitive element 800 may be improved as compared with the case when the first electrode 810 and the second electrode 830 are disposed on different surfaces of the electroactive layer 820.

In the meantime, the first portion 821 of the electroactive layer 820 corresponding to the core area CA in which the first electrode 810 and the second electrode 830 are disposed has a thickness smaller than that of the second portion 823 corresponding to the edge area EA. Therefore, the vibration strength of the first portion 821 may be improved at the same driving voltage. Further, the second thickness $t_2$ of the second portion 823 corresponding to the edge area EA in which the first wiring line 841 is in contact with the first electrode 810 and the second wiring line 843 is in contact with the second electrode 830 is larger than the first thickness $t_1$ of the first portion 821. Therefore, the dielectric breakdown which may be generated at the contact point of the first wiring line 841 and the first electrode 810 and the contact point of the second wiring line 843 and the second electrode 830 may be minimized.

Figure 10A:
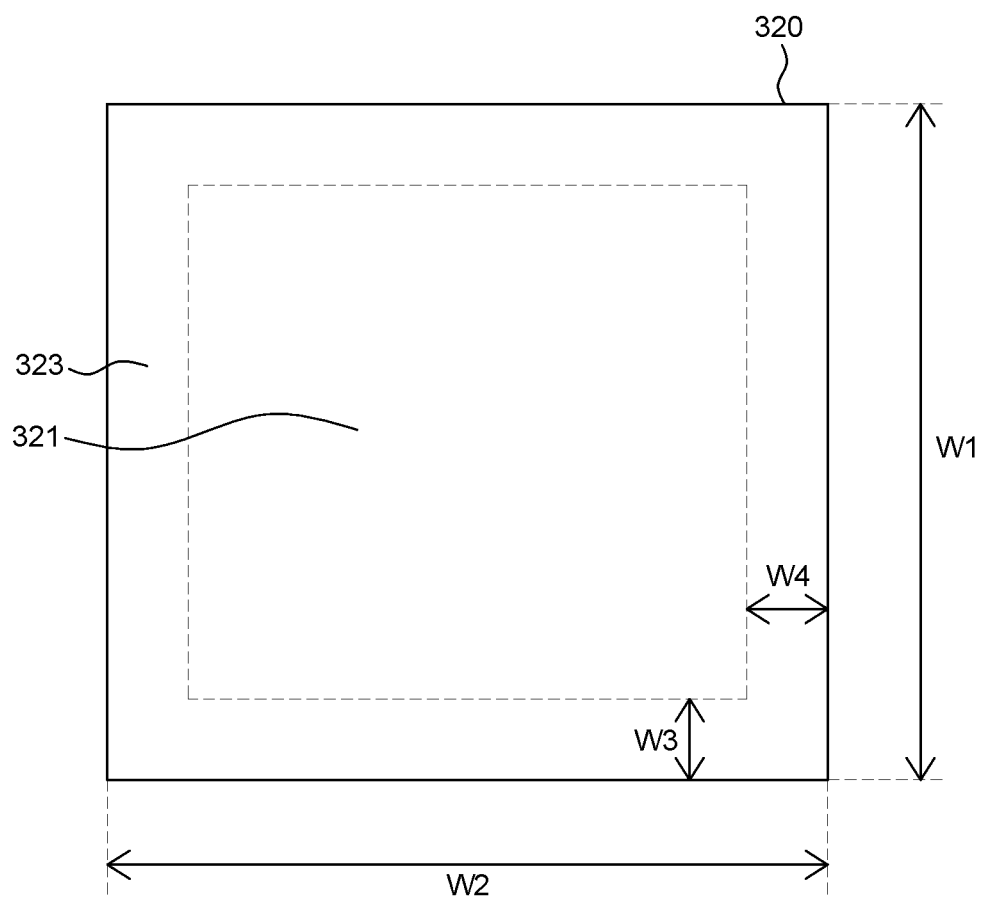
FIGS. 10A and 10B are plan views of an electroactive layer for explaining a reduced fault rate and an improved vibration strength of a touch sensitive element according to an exemplary embodiment of the present disclosure.
Figure 10B:
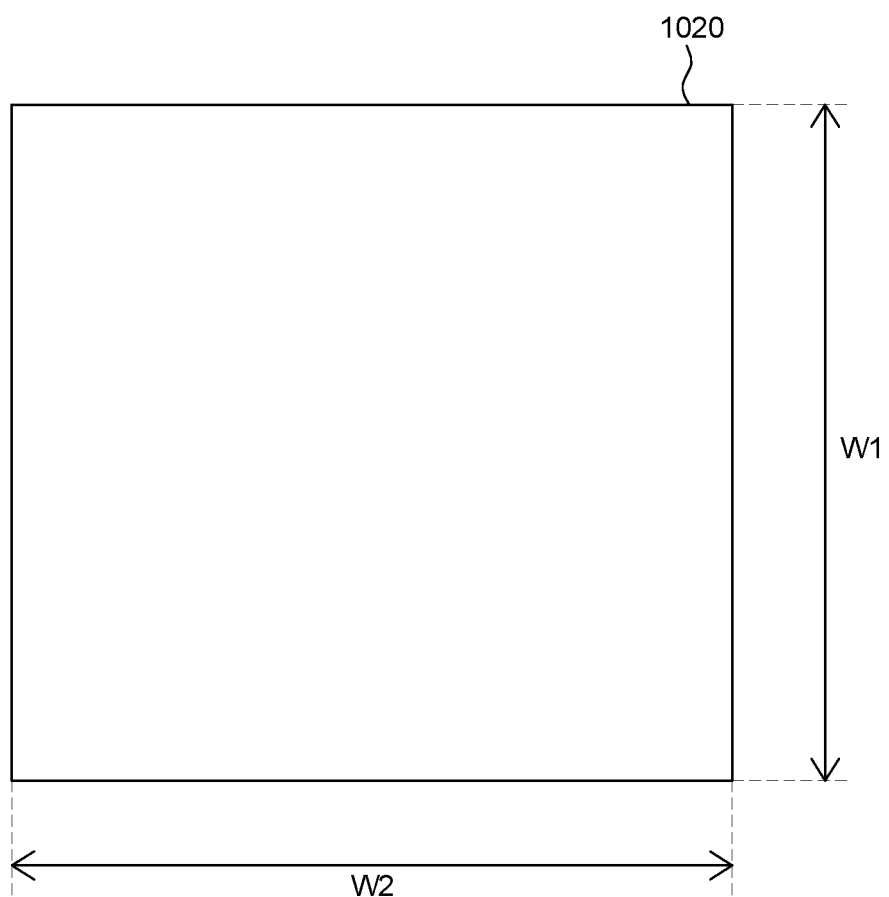

FIGS. 10A and 10B are plan views of an electroactive layer for explaining a reduced fault rate and an improved vibration strength of a touch sensitive element according to an exemplary embodiment of the present disclosure. Specifically, FIG. 10A is a plan view of the electroactive layer 320 of the touch sensitive element according to the first and second exemplary embodiments of the present disclosure and FIG. 10B is a plan view of an electroactive layer 1020 of a touch sensitive element according to a comparative embodiment.

The touch sensitive elements according to the first and second exemplary embodiments of the present disclosure have the same structure as the touch sensitive element 300 according to another exemplary embodiment of the present disclosure which has been described with reference to FIGS. 3 and 4. Specifically, the electroactive layer 320 of the touch sensitive element according to the first and second exemplary embodiments includes a first portion 321 having a first thickness and a second portion 323 having a second thickness larger than the first thickness. The first thickness of the first portion 321 is gradually increased toward the outside of the first portion 321 from the center of the first portion 321. The electroactive layer 320 is formed by adding cyano oligomer to PVDF-TrFE-CFE and both a first width w1 and a second width w2 of the electroactive layer 320 are 100 mm. However, widths of the second portion 323 defined as a distance from an outline of the second portion 323 to a boundary line at which the second portion 323 is in contact with the first portion 321 includes a horizontal width W4 of 20 mm and a vertical width W3 of 20 mm. Both the first electrode and the second electrode of the touch sensitive elements according to the first and second exemplary embodiments are formed of an ITO material.

However, the first thickness of the first portion 321 of the touch sensitive element according to the first exemplary embodiment is different from the first thickness of the first portion 321 of the touch sensitive element according to the second exemplary embodiment.

Specifically, the first thickness of the first portion 321 of the touch sensitive element according to the first exemplary embodiment is 30 μm at a center of the first portion 321 and is gradually increased toward the outside of the first portion 321 from 30 μm to 70 μm. Further, the second thickness of the second portion 323 is 70 μm.

In contrast, the first thickness of the first portion 321 of the touch sensitive element according to the second exemplary embodiment is 40 μm at a center of the first portion 321 and is gradually increased toward the outside of the first portion 321 from 40 μm to 70 μm. Further, the second thickness of the second portion 323 is 70 μm.

A touch sensitive element according to a comparative embodiment is a touch sensitive element to be compared with the touch sensitive element according to the first and second exemplary embodiments. The touch sensitive element according to the comparative embodiment has the same configuration as the touch sensitive element according to the first exemplary embodiment except that it includes an electroactive layer 1020 having the same thickness in all areas. That is, the electroactive layer 1020 of the touch sensitive element according to the comparative embodiment is formed by adding cyano oligomer to PVDF-TrFE-CFE and both a first width w1 and a second width w2 of the electroactive layer 1020 are 100 mm. The electroactive layer 1020 of the touch sensitive element according to the comparative embodiment is uniformly 40 μm.

In order to identify a reduced fault rate and an improved vibration strength of the touch sensitive element according to the exemplary embodiments of the present disclosure, a dielectric breakdown voltage, a fault rate, and a vibration acceleration of each of the touch sensitive element according to the first exemplary embodiment, the second exemplary embodiment, and the comparative embodiment are measured.

The dielectric breakdown voltage is measured by applying voltages which increase at intervals of 50 V to both ends of the first electrode and the second electrode of the touch sensitive element according to the first exemplary embodiment, the second exemplary embodiment, and the comparative embodiment for 20 seconds to measure a voltage at an instant of occurrence of dielectric breakdown of the electroactive layer.

The fault rate is obtained by counting the number of elements in which a short-circuit of the wiring line is generated by driving the touch sensitive elements according to the first exemplary embodiment, the second exemplary embodiment, and the comparative embodiment at a driving voltage of 400 V of 100 Hz after manufacturing individually ten touch sensitive elements according to the first exemplary embodiment, the second exemplary embodiment, and the comparative embodiment.

The vibration acceleration is measured by driving the touch sensitive elements according to the first exemplary embodiment, the second exemplary embodiment, and the comparative embodiment at a driving voltage of 400 V of 100 Hz.

The dielectric breakdown voltage, the fault rate, and the vibration acceleration experimented for the touch sensitive elements according to the first exemplary embodiment, the second exemplary embodiment, and the comparative embodiment are represented in the following Table 2.

TABLE 2

| classification | Thickness of first portion | Thickness of second portion | Dielectric breakdown voltage | Fault rate | Vibration acceleration |
| --- | --- | --- | --- | --- | --- |
| First exemplary embodiment | 30 μm | 70 μm | 1.70 kV | 4/10 | 1.6 G |
| Second exemplary embodiment | 40 μm | 70 μm | 1.70 kV | 2/10 | 1.3 G |
| Comparative embodiment | 40 μm | 40 μm | 0.95 kV | 6/10 | 1.3 G |

As represented in Table 2, it is understood that a fault rate of the touch sensitive element according to the first exemplary embodiment and the second exemplary embodiment including an electroactive layer having a thickness variation is significantly reduced as compared with the touch sensitive element according to the comparative embodiment including an electroactive layer which does not have a thickness variation. Specifically, the touch sensitive element according to the comparative embodiment has a low dielectric breakdown voltage of 0.95 kV and a wiring short-circuit failure is generated in six elements out of ten elements. In contrast, the touch sensitive element according to the first exemplary embodiment has a high dielectric breakdown voltage of 1.70 kV and a wiring short-circuit failure is generated in four elements out of ten elements. Further, the touch sensitive element according to the second exemplary embodiment has a high dielectric breakdown voltage of 1.70 kV and a wiring short-circuit failure is generated in two elements out of ten elements.

In the meantime, it is understood that the touch sensitive element according to the first exemplary embodiment and the second exemplary embodiment including an electroactive layer having a thickness variation has an excellent vibration strength as compared with the touch sensitive element according to the comparative embodiment including an electroactive layer which does not have a thickness variation. Specifically, the touch sensitive element according to the comparative embodiment has a vibration strength of 1.3 G but the touch sensitive element according to the first exemplary embodiment has a vibration strength of 1.6 G. In the meantime, the touch sensitive element according to the second exemplary embodiment has the vibration strength of 1.3 G which is the same as the vibration strength of the touch sensitive element according to the comparative embodiment. Therefore, even though there is no advantage of the vibration strength, there is an advantage in that the fault rate of the touch sensitive element according to the second exemplary embodiment is improved more than the touch sensitive element according to the comparative embodiment.

Figure 11:
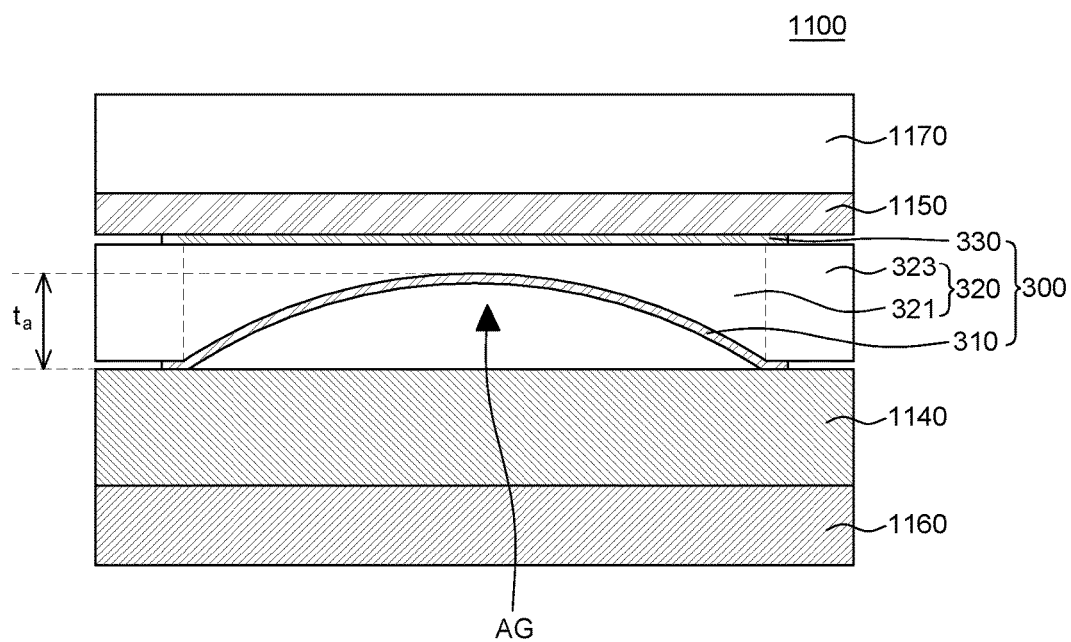
FIG. 11 is a cross-sectional view of a display device according to an exemplary embodiment of the present disclosure.

FIG. 11 is a cross-sectional view of a display device according to an exemplary embodiment of the present disclosure. The touch sensitive element 300 included in the display device 100 of FIG. 11 is the same as the touch sensitive element 300 according to another exemplary embodiment of the present disclosure which has been described with reference to FIGS. 3 and 4. Therefore, a redundant description of the touch sensitive element 300 will be omitted.

Referring to FIG. 11, a display device 1100 includes a display panel 1140, a touch sensitive element 300, a touch element 1150, a cover window 1170, and a structure 1160. In FIG. 11, specific illustration of the components of the touch element 1150, the display panel 1140, and the structure 1160 will be omitted.

The display panel 1140 refers to a panel in which a display element for displaying an image in the display device 1100 is disposed. As the display panel 1140, for example, various display panels such as an organic light emitting display panel, a liquid crystal display panel, and an electro phoretic display panel may be used.

The touch element 1150 refers to a panel which senses a user's touch input to the display device 1100. As the touch element 1150, for example, a capacitive type, a resistive type, a surface ultrasonic wave type, or an infrared ray type may be used, but a capacitive type touch element may be used as the touch panel 1150.

The cover window 1170 is configured to cover the touch element 1150, the touch sensitive element 300, the display panel 1140, and the structure 1160 and protect the above components from the external impact, foreign substances, or moisture. For example, the cover window 1170 may be formed of a material such as glass with good rigidity or plastic that is thermally formable and has a good workability.

A structure 1160 may be disposed below the display panel 1140 and may include various components according to the type of display panel 1140. For example, when the display panel 1140 is a liquid crystal display panel including liquid crystal, the structure 1160 may include a backlight unit which provides light to the display panel 1140. Further, when the display panel 1140 is an organic light emitting display panel including an organic light emitting diode, the structure 1160 may include any one of a heat radiating sheet, a pressure sensor, and a back cover. The heat radiating sheet is a sheet which externally discharges heat of the display panel 1140 from the lower portion of the display panel 1140 and may be formed of a metal having excellent thermal conductivity. The pressure sensor is a sensor which may measure an intensity of a user's touch input and may be implemented as a capacitance type. For example, the pressure sensor may be configured of two opposing electrodes and an elastic insulating member disposed between two electrodes. An interval between two electrodes changes in accordance with the user's touch input so that the capacitance change generated thereby is measured to measure an intensity of a touch pressure. The back cover is a member which protects a lower portion of the display panel 1140 and is formed of metal or plastic.

In some exemplary embodiments, the display panel 1140 may include a flexible substrate. In this case, the display panel 1140 has a small thickness and flexibility and the display device 1100 may be implemented as a flexible display device. In this case, the structure 1160 may include a back plate which supports the display panel 1140 in a lower portion of the display panel 1140. The back plate may be configured by a plastic film which may suppress the flexible substrate of the display panel 1140 from being warped or torn.

The touch sensitive element 300 is disposed between the touch element 1150 and the display panel 1140 and includes a first electrode 310, an electroactive layer 320, and a second electrode 330. An interval $t_a$ between the first portion 321 of the electroactive layer 320 and the display panel 1140 is different from an interval between the second portion 323 and the display panel 1140. Specifically, the interval $t_a$ between the first portion 321 and the display panel 1140 is larger than the interval between the second portion 323 and the display panel 1140. The first portion 321 and the display panel 1140 are spaced apart from each other so that an air gap AG is formed between the electroactive layer 320 and the display panel 1140.

The second portion 323 of electroactive layer 320 and the display panel 1140 are adhered to each other. Even though not illustrated in FIG. 11, an adhesive layer may be disposed between the second portion 323 of the electroactive layer 320 and the display panel 1140 and the second portion 323 and the display panel 1140 may be adhered to each other through the adhesive layer.

As illustrated in FIG. 11, the interval $t_a$ between the first portion 321 and the display panel 1140 is gradually decreased toward the boundary line of the first portion 321 and the second portion 323 from the center of the first portion 321. Therefore, a slope is formed between the first portion 321 and the second portion 323. A maximum value of the interval $t_a$ between the first portion 321 and the display panel 1140 may be equal to or larger than 15 μm. As mentioned above, the first portion 321 of the electroactive layer 320 has a larger thickness than the second portion 323, so that the interval between the first electrode 310 and the second electrode 330 in the first portion 321 may be reduced. Therefore, an intensity of an electric field which acts on the first portion 321 may be increased and the vibration strength of the first portion 321 may be improved. Further, a thickness of the second portion 323 in which the first wiring line which is in contact with the first electrode 310 and the second wiring line which is in contact with the second electrode 330 is larger than the thickness of the first portion 321. Therefore, the dielectric breakdown which may be generated at a contact point of the first electrode 310 and the first wiring line and a contact point of the second electrode 330 and the second wiring line may be efficiently reduced. When the maximum value of the interval $t_a$ between the first portion 321 and the display panel 1140 is smaller than 15 μm, a thickness difference between the first portion 321 and the second portion 323 is very small. Therefore, it is difficult to effectively reduce a possibility of occurrence of dielectric breakdown while improving the vibration strength of the touch sensitive element 300. That is, when the maximum value of the interval $t_a$ between the first portion 321 and the display panel 1140 is smaller than 15 μm, the thickness of the first portion 321 is large so that it is difficult to increase the vibration strength of the electroactive layer 320 or the thickness of the second portion 323 is small so that the possibility of occurrence of dielectric breakdown may be increased.

In the meantime, a space between the electroactive layer 320 and the display panel 1140 is formed so that the vibration strength of the electroactive layer 320 may be further improved. As mentioned above, the electroactive layer 320 is vibrated by the electric field generated between the first electrode 310 and the second electrode 330. The first portion 321 of the electroactive layer 320 has a smaller thickness than that of the second portion 323 so that the intensity of the electric field which acts on the first portion 321 is increased and the vibration strength of the first portion 321 is improved. Further, the first portion 321 is spaced apart from the display panel 1140 and an air gap AG is formed between the first portion 321 and the display panel 1140 so that the first portion 321 may considerably vibrate up and down in the space of the airgap AG. Accordingly, the vibration strength of the touch sensitive element 300 may be further improved.

Further, as illustrated in FIG. 11, one surface of the electroactive layer 320 is flat. That is, one surface of the electroactive layer 320 on which the second electrode 330 is disposed is flat and the first electrode 310 is bent along a curved surface of the first portion 321 of the electroactive layer 320. Therefore, one surface of the touch sensitive element 300 is flat and the other surface which is opposite to the one surface is bent. The flat one surface of the touch sensitive element 300 is in contact with the touch element 1150 disposed above the touch sensitive element 300 and the other bent surface is in contact with the display panel 1140 disposed below the touch sensitive element 300. In this case, the vibration of the electroactive layer 320 is transmitted to a direction perpendicular to the one surface through the flat one surface and a vibration strength in an upward direction of the touch sensitive element 300 may be larger than a vibration strength in a downward direction. Specifically, a user watches an image of the display panel 1140 through the cover window 1170 of the display device 1100 and applies a touch input onto an upper surface of the cover window 1170. Further, the touch sensitive element 300 may provide a tactile feedback in response to the user's touch input. That is, the vibration of the touch sensitive element 300 is transmitted to the user through the cover window 1170. The stronger the upward vibration of the touch sensitive element 300, the larger the tactile feedback which is provided to the user. Therefore, it is required to maximize the upward vibration strength of the touch sensitive element 300.

The display device 1100 according to an exemplary embodiment of the present disclosure includes an electroactive layer 320 in which one surface is flat and the other surface is a curved surface. The first portion 321 of the electroactive layer 320 is spaced apart from the display panel 1140 to form an airgap AG. The first electrode 330 and the second electrode 310 form a vertical electric field and the electroactive layer 320 may vertically vibrate based on the vertical electric field. In this case, since the airgap AG is formed in a lower direction of the electroactive layer 320, the downward vibration of the electroactive layer 320 may not be transmitted to the display panel 1140. In contrast, the upward vibration of the electroactive layer 320 may be mostly transmitted to the touch element 1150 through the flat one surface of the electroactive layer 320, so that the upward vibration of the electroactive layer 320 may be satisfactorily transmitted to the touch element 1150. Therefore, the upward vibration strength of the touch sensitive element 300 may be maximized and the maximized tactile feedback may be transmitted to the user.

Figure 12:
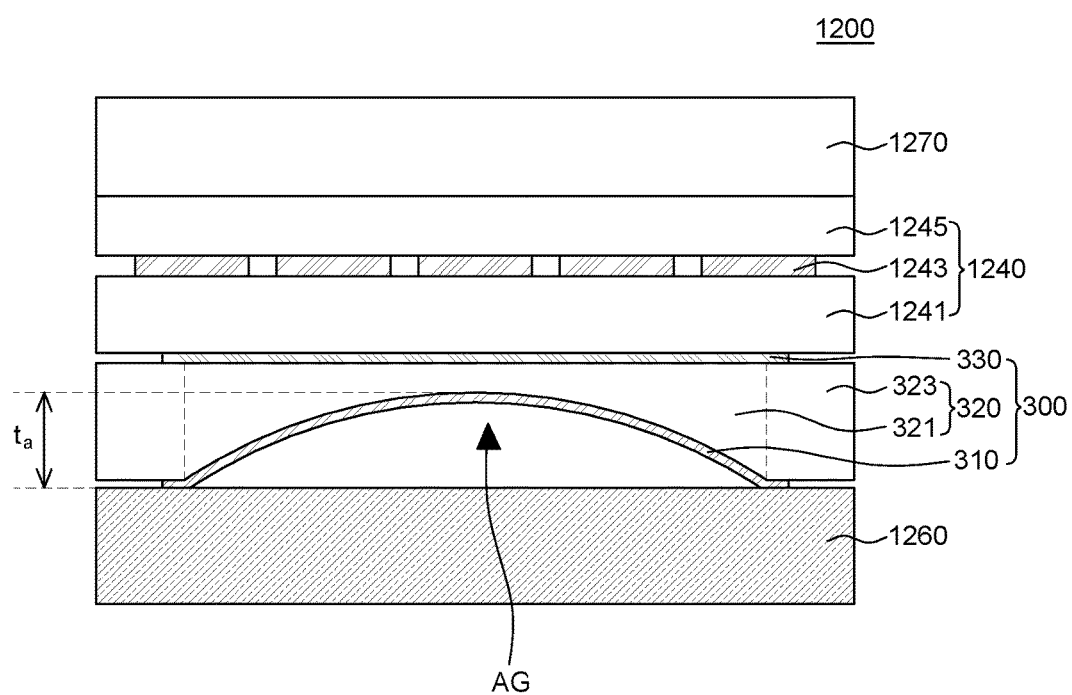
FIG. 12 is a cross-sectional view of a display device according to another embodiment of the present disclosure.

FIG. 12 is a cross-sectional view of a display device according to another embodiment of the present disclosure. A display device 1200 of FIG. 12 is the same as the display device 1100 of FIG. 11 except that a display panel 1240 includes a plurality of touch electrodes 1243 and a touch element is omitted so that a redundant description will be omitted. In FIG. 12, the configurations of the display panel 1240 excluding the plurality of touch electrodes 1243 are not. illustrated.

Referring to FIG. 12, the display device 1200 according to another exemplary embodiment of the present disclosure includes a touch element integrated display panel 1240 including a plurality of touch electrodes 1243. Specifically, the display panel 1240 includes a first substrate 1241, a plurality of touch electrodes 1243, and a second substrate 1245. The touch element integrated display panel 1240 may be a liquid crystal display panel including a plurality of touch electrodes 1243. The plurality of touch electrodes 1243 may serve as a pixel electrode or a common electrode of the liquid crystal display panel. In this case, a common voltage or a pixel voltage is applied to the plurality of touch electrodes 1243 during a display interval when the image is displayed on the display panel 1240, and a touch voltage is applied to the plurality of touch electrodes 1243 during a touch sensing interval when the touch input is sensed. However, the present disclosure is not limited thereto and the display panel 1240 may be an organic light emitting display panel 1240 including a plurality of touch electrodes 1243. In this case, the plurality of touch electrodes 1243 may be disposed below the second substrate 1245 or disposed above an encapsulation layer which encapsulates an organic light emitting diode on the first substrate 1241.

The touch sensitive element 300 may be disposed below the display panel 1240. That is, since the display panel 1240 includes a plurality of touch electrodes 1243, the display panel 1240 may be disposed below the cover window 1270 to precisely sense the touch input. Further, the touch sensitive element 300 is disposed below the display panel 1240.

A structure 1260 is disposed below the touch sensitive element 300 and is adhered to the second portion 323 of the electroactive layer 320. The structure 1260 and the first portion 321 of the electroactive layer 320 are spaced apart from each other and an airgap AG is formed between the structure 1260 and the first portion 321.

The structure 1260 may include various components. When the display panel 1240 is implemented as a touch element integrated liquid crystal display panel 1240, the structure 1260 may include a backlight unit.

In the display device 1200 according to another exemplary embodiment of the present disclosure, since a plurality of touch electrodes 1243 is provided on the display panel 1240, a separate touch element may be omitted. Therefore, an entire thickness of the display device 1200 may be reduced and a thin and light display device 1200 may be provided. Even though the touch sensitive element 300 is disposed below the display panel 1240, the touch sensitive element 300 includes an electroactive layer 320 including a first portion 321 having a small thickness and a second portion 323 having a large thickness so that a tactile feedback with an excellent vibration strength may be transmitted. Specifically, the airgap AG is formed between the touch sensitive element 300 and the structure 1260 and the flat upper surface of the touch sensitive element 300 is in contact with the display panel 1240. Therefore, the vertical vibration of the touch sensitive element 300 may be transmitted to the upward direction more than the downward direction. Therefore, the upward vibration strength of the touch sensitive element 300 may be maximized and the large tactile feedback may be transmitted to the user.

Figure 13:
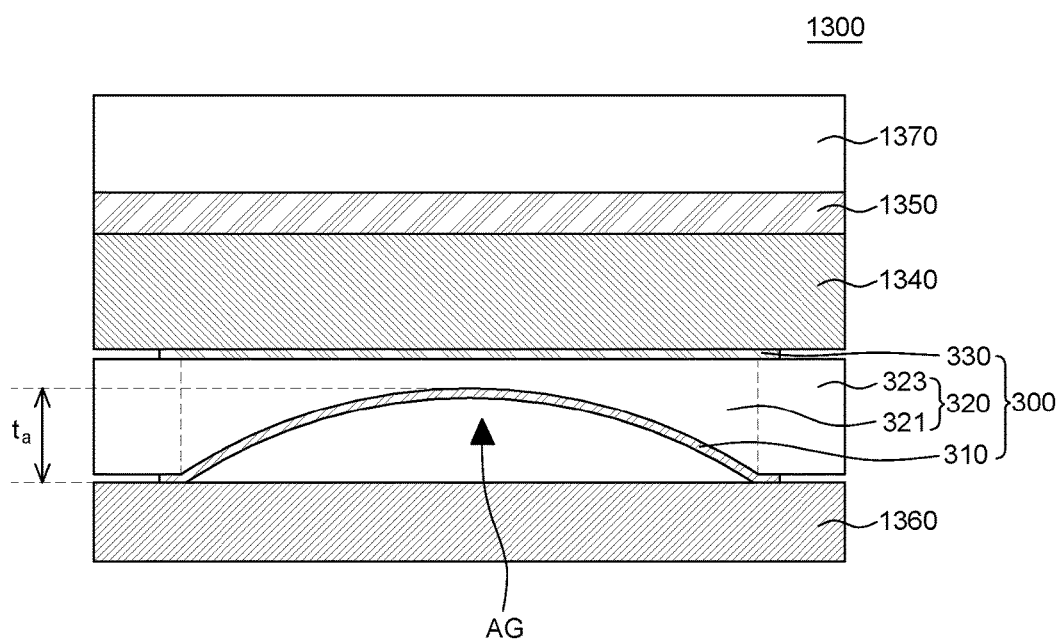
FIG. 13 is a cross-sectional view of a display device according to still another embodiment of the present disclosure.

FIG. 13 is a cross-sectional view of a display device according to still another exemplary embodiment of the present disclosure. A display device 1300 of FIG. 13 is the same as the display device 1100 of FIG. 11 except that the display device 1300 includes a touch sensitive element 300 disposed below the display panel 1340 so that a redundant description will be omitted. In FIG. 13, detailed configurations of the touch element 1350 and the display panel 1340 are not illustrated.

Referring to FIG. 13, a touch sensitive element 300 is disposed below the display panel 1340 and a structure 1360 is disposed below the touch sensitive element 300. A vibration of the touch sensitive element 300 is transmitted to a cover window 1370 through the display panel 1340 and the touch element 1350 and the user may be provided with the tactile feedback through the cover window 1370.

In the display device according to still another exemplary embodiment of the present disclosure, the display device 1340 and the touch element 1350 are disposed above the touch sensitive element 300. However, since the touch sensitive element 300 has an excellent vibration strength, the tactile feedback generated in the touch sensitive element 300 may be effectively transmitted to the user. That is, the touch sensitive element 300 includes an electroactive layer 320 in which a thickness of a portion where the first electrode 310 and the second electrode 330 are disposed is small. Therefore, it is possible to increase the intensity of the electric field between the first electrode 310 and the second electrode 330 and improve the vibration strength of the electroactive layer 320. Further, the first portion 321 of the electroactive layer 320 and the structure 1360 are spaced apart from each other so that an airgap AG is formed between the first portion 321 and the structure 1360. Therefore, the vibration of the electroactive layer 320 which is downwardly transmitted is minimized by the airgap AG and the vibration which is upwardly transmitted may be maximized. Therefore, even though the display panel 1340 and the touch element 1350 are disposed above the touch sensitive element 300, the touch sensitive element 300 may transmit an excellent tactile feedback to the user.

In the meantime, when the display panel 1340 is a flexible display panel including a flexible substrate, the touch sensitive element 300 may serve as a back plate which supports the display panel 1340 below the display panel 1340. In this case, a separate back plate which suppresses the flexible substrate from being warped or torn may be omitted so that the thickness of the display device 1300 may be reduced.

When the display panel 1340 is a flexible display panel including a flexible substrate, the structure 1360 may include a heat radiating sheet. That is, the flexible display panel has a small thickness, so that lots of heat may be generated and reliability of various components of the display device 1300 may be lowered. The structure 1360 may be disposed below the touch sensitive element 300 to serve as a heat radiating sheet which discharges heat generated in the display device 1300 to the outside and be formed of a metal film having excellent heat conductivity.

The exemplary embodiments of the present disclosure can also be described as follows:

According to an aspect of the present disclosure, a touch sensitive element includes an electroactive layer, and an electrode on at least one surface of the electroactive layer. The electroactive layer has a first portion having a first thickness and a second portion which has a second thickness different from the first thickness and is in contact with the first portion at an outside of the first portion. Since the touch sensitive element according to the exemplary embodiment of the present disclosure includes the electroactive layer which includes a first part having a first thickness and a second portion having a second thickness different from the first thickness. Therefore, an intensity of an electric field applied to the first portion may be increased and a dielectric breakdown voltage of the second portion may be increased. Therefore, it is possible to simultaneously improve the vibration strength of the touch sensitive element and minimize wiring short-circuit failure due to the dielectric breakdown.

The first portion of the electroactive layer may overlap the electrode and the first thickness of the first portion may be smaller than the second thickness of the second portion.

The touch sensitive element may further include a wiring line which is connected to the electrode in the second portion of the electroactive layer.

A boundary line at which the first portion and the second portion are in contact with each other may be a straight line, a quadrangle, or a circle.

The first thickness of the first portion may be gradually increased toward the boundary line at which the second portion and the first portion are in contact with each other from a center of the first portion.

An inclination of a slope of a region where the first thickness of the first portion is gradually increased may be equal to or smaller than 0.1°.

The first thickness of the first portion may be equal to or smaller than 35 μm and the second thickness of the second portion may be equal to or larger than 50 μm.

A ratio of the first thickness of the first portion and the second thickness of the second portion may be 1:1.75 to 1:3.5.

The electrode may include a first electrode disposed on an upper surface of the electroactive layer; and a second electrode disposed on a lower surface of the electroactive layer and the first electrode and the second electrode may be configured by a plurality of patterned pattern electrodes.

One surface of the electroactive layer may be flat and a vibration of the electroactive layer may be transmitted in a direction perpendicular to the one surface through the one surface.

According to an aspect of the present disclosure, a display device includes a touch element, a touch sensitive element, and a structure. The touch element includes a plurality of touch electrodes. The touch sensitive element may be located below the touch element and have an electroactive layer having a first portion and a second portion being in contact with the first portion at the outside and an electrode disposed on at least one surface of the electroactive layer. A structure may be located below the touch sensitive element. An interval between the first portion of the electroactive layer and the structure is different from an interval between the second portion of the electroactive layer and the structure. The display device according to an exemplary embodiment of the present disclosure includes an electroactive layer and a structure and an interval between the first portion of the electroactive layer and the structure is different from an interval between the second portion and the structure. Therefore, an intensity of the electric field applied to the first portion of the electroactive layer is increased and a vertical vibration of the first portion may be further amplified in the space between the first portion and the structure. As a result, the display device may transmit an excellent tactile feedback to the user.

The display device may further include a display panel which displays an image and the touch element may be disposed above the display panel.

The display panel may be an organic light emitting display panel and the structure may include at least one of a heat radiating sheet, a pressure sensor, and a back cover.

The display device may further include a display panel which displays an image. The plurality of touch electrodes may be located in the display panel.

The display panel may be a liquid crystal display panel, and the structure may include a backlight unit.

The structure may include a display panel which displays an image.

The display panel may be an organic light emitting display panel or a liquid crystal display panel.

The first portion of the electroactive layer may be spaced apart from the structure and the second portion of the electroactive layer may be adhered to the structure.

An interval between the first portion and the structure may be gradually decreased toward a boundary line at which the first portion and the second portion are in contact with each other from a center of the first portion and a maximum value of the interval between the first portion and the structure may be 15 μm or larger.

An inclination of a slope of a region where the interval between the first portion and the structure is gradually decreased may be equal to or smaller than 0.1°.

According to still another aspect of the present disclosure, a display device includes a display panel, a cover window, and a touch sensitive element. The cover window is disposed above the display panel. The touch sensitive element is disposed below the cover window and has an electroactive layer. The electroactive layer has a first portion having a first thickness and a second portion being in contact with the first portion at an outside of the first portion and has a second thickness different from the first thickness.

The touch sensitive element may be disposed above the display panel and the first portion of the electroactive layer may be spaced apart from the display panel and the second portion of the electroactive layer may be adhered to the display panel.

The display device may further include a touch element which is disposed above the display panel and includes a plurality of touch electrodes and the touch sensitive element may be disposed below the touch element.

The display device may further include a structure disposed below the display panel. The touch sensitive element may be disposed between the display panel and the structure and the first portion of the electroactive layer may be spaced apart from the structure and the second portion may be adhered to the structure.

The display panel may include liquid crystal, and the structure may include a backlight unit.

The display panel may include an organic light emitting diode, and the structure may include at least one of a heat radiating sheet, a pressure sensor, and a back cover.

The display panel may include a flexible substrate and the touch sensitive element may be adhered to the flexible substrate to support the flexible substrate.

A thickness of the first portion may be equal to or smaller than 35 μm and a thickness of the second portion may be equal to or larger than 50 μm.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical spirit of the present disclosure. The scope of the technical spirit of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A touch sensitive element, comprising:
   an electroactive layer comprising a first portion of a first thickness and a second portion of a second thickness that is greater than the first thickness;
   a first electrode electrically coupled to a surface of the first portion on the electroactive layer;
   a second electrode electrically coupled to a same surface or a different surface of the first portion of the electroactive layer as the first electrode, wherein a part of the first electrode and a part of the second electrode extend to the second portion of the electroactive layer;
   a first wiring line connected to the part of the first electrode, the first wiring line on the second portion of the electroactive layer;
   a second wiring line connected to the part of the second electrode, the second wiring line on the second portion of the electroactive layer;
   wherein the electroactive layer is configured to vibrate responsive to applying a voltage difference between the second electrode and the first electrode via the first wiring line and the second wiring line.

2. The touch sensitive element according to claim 1, wherein the first portion of the electroactive layer overlaps the first electrode and the second electrode.

3. The touch sensitive element according to claim 1, wherein the first electrode and the second electrode are configured by a metal mesh in which a metal material is disposed in a mesh form so that the first electrode and the second electrode serve as transparent electrodes.

4. The touch sensitive element according to claim 2, wherein the second portion of the electroactive layer at least partially surrounds the first portion of the electroactive layer and is in contact with the first portion, and the second portion comprises a quadrangle shape or a circular shape.

5. The touch sensitive element according to claim 2, wherein the first thickness of the first portion is gradually increased from a center of the first portion toward the second portion.

6. The touch sensitive element according to claim 5, wherein a slope of a region of the first portion that gradually increases from the center of the first portion toward the second portion is equal to or less than 0.1°.

7. The touch sensitive element according to claim 1, wherein the first thickness of the first portion is equal to or less than 35 μm and the second thickness of the second portion is equal to or less than 50 μm.

8. The touch sensitive element according to claim 1, wherein a ratio of the first thickness of the first portion and the second thickness of the second portion is 1:1.75 to 1:3.5.

9. The touch sensitive element according to claim 1, wherein the first electrode is on a first surface of the electroactive layer and the second electrode is on a second surface of the electroactive layer that is opposite the first surface, and
   wherein either the first electrode or the second electrode comprises a plurality of patterned pattern electrodes.

10. The touch sensitive element according to claim 1, wherein a first surface of a plurality of surfaces of the electroactive layer is substantially flat and a vibration of the electroactive layer is transmitted in a direction perpendicular to the first surface.

11. A display device, comprising:
    a structure;
    a touch sensitive element over the structure, the touch sensitive element comprising:
    an electroactive layer comprising a first portion of a first thickness and a second portion of a second thickness that is greater than the first thickness;

a first electrode electrically coupled to a surface of the electroactive layer; and a second electrode electrically coupled to a same surface or a different surface of the electroactive layer as the first electrode, the electroactive layer configured to vibrate responsive to applying a voltage difference between the second electrode and the first electrode; and a touch element over the touch sensitive element, the touch element configured to sense touch and includes a plurality of touch electrodes;

wherein at least a portion of the first portion of the electroactive layer is free from contacting with the structure such that an air gap is formed between the portion of the first portion of the electroactive layer and the structure, and the second portion of the electroactive layer is in contact with the structure.

12. The display device according to claim 11, further comprising:

a display panel configured to display an image, wherein the touch element is disposed over the display panel.

13. The display device according to claim 12, wherein the display panel is an organic light emitting display panel, and the structure includes at least one of a heat radiating sheet, a pressure sensor, or a back cover.

14. The display device according to claim 11, further comprising:

a display panel configured to display an image, wherein the plurality of touch electrodes is located in the display panel.

15. The display device according to claim 14, wherein the display panel is a liquid crystal display panel, and the structure includes a backlight unit.

16. The display device according to claim 11, wherein the structure includes a display panel which displays an image.

17. The display device according to claim 16, wherein the display panel is an organic light emitting display panel or a liquid crystal display panel.

18. The display device according to claim 1, wherein the air gap between the first portion and the structure gradually decreases from a center of the first portion toward the second portion, and a maximum value of the air gap between the first portion and the structure is 15 μm or larger.

19. The display device according to claim 18, wherein a slope of a region of the first portion that gradually increases from the center of the first portion toward the second portion is equal to or less than 0.1°.

20. A display device, comprising:

a display panel;

a cover window over the display panel; and a touch sensitive element under the cover window, the touch sensitive element including:

an electroactive layer configured to vibrate responsive to an application of an electric field to the electroactive layer, the electroactive layer comprising a first portion having a first thickness and a second portion having a second thickness that is greater than the first thickness;

wherein at least a portion of the first portion of the electroactive layer is free from contacting with the display panel such that an air gap is formed between the portion of the first portion of the electroactive layer and the display panel, and the second portion of the electroactive layer is in contact with the display panel.

21. The display device according to claim 20, wherein the touch sensitive element is over the display panel.

22. The display device according to claim 21, further comprising:

a touch element over the display panel and including a plurality of touch electrodes, wherein the touch sensitive element is disposed under the touch element.

23. The display device according to claim 20, further comprising:

a structure disposed under the display panel, wherein the touch sensitive element is disposed between the display panel and the structure, and the first portion of the electroactive layer is not in contact with the structure and the second portion is in contact with the structure.

24. The display device according to claim 23, wherein the display panel includes liquid crystal, and the structure includes a backlight unit.

25. The display device according to claim 23, wherein the display panel includes an organic light emitting diode, and the structure includes at least one of a heat radiating sheet, a pressure sensor, and a back cover.

26. The display device according to claim 23, wherein the display panel includes a flexible substrate, and the touch sensitive element is connected to the flexible substrate to support the flexible substrate.

27. The display device according to claim 20, wherein the first thickness of the first portion is equal to or less than 35 μm and the second thickness of the second portion is equal to or larger than 50 μm.

* * * * *